(12) United States Patent
Li et al.

(10) Patent No.: US 11,454,840 B2
(45) Date of Patent: Sep. 27, 2022

(54) DISPLAY PANEL AND PREPARATION METHOD THEREOF, AND DISPLAY APPARATUS

(71) Applicant: BOE Technology Group Co., Ltd., Beijing (CN)

(72) Inventors: Shulei Li, Beijing (CN); Menghua Zhao, Beijing (CN); Changhan Hsieh, Beijing (CN); Zhao Kang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/225,077

(22) Filed: Apr. 7, 2021

(65) Prior Publication Data

US 2022/0091460 A1   Mar. 24, 2022

(30) Foreign Application Priority Data

Sep. 22, 2020  (CN) .......................... 202011003986.X

(51) Int. Cl.
*G02F 1/1335*   (2006.01)
*G02F 1/1343*   (2006.01)
(Continued)

(52) U.S. Cl.
CPC .... *G02F 1/133514* (2013.01); *G02F 1/13394* (2013.01); *G02F 1/13439* (2013.01); *G02F 1/133512* (2013.01); *G02F 1/133516* (2013.01); *G02F 1/134336* (2013.01); *G02F 1/1368* (2013.01); *G02F 1/133305* (2013.01); *G02F 1/134363* (2013.01); *H01L 27/283* (2013.01)

(58) Field of Classification Search
CPC ......... G02F 1/133514; G02F 1/133512; G02F 1/133516; G02F 1/13394; G02F 1/134336; G02F 1/13439; G02F 1/133305; G02F 1/134363; G02F 1/1368
See application file for complete search history.

(56) References Cited

U.S. PATENT DOCUMENTS

2002/0027636 A1\*  3/2002  Yamada ............ G02F 1/133305
                                                                349/155
2015/0029683 A1\*  1/2015  Kim .................... H01L 51/0097
                                                                361/749
(Continued)

*Primary Examiner* — Hoan G Nguyen
(74) *Attorney, Agent, or Firm* — Ling Wu; Stephen Yang; Ling and Yang Intellectual Property

(57) ABSTRACT

Provided are a display panel, a preparation method thereof, and a display apparatus. The display panel includes an array substrate and a color filter substrate aligned and combined into a cell. The color filter substrate includes a first base substrate and a plurality of color resist blocks arranged at intervals on the first base substrate. The array substrate includes a second base substrate and a plurality of pixel electrodes arranged at intervals on the second base substrate. The pixel electrodes are in one-to-one correspondence with the color resist blocks. The display panel includes a bending area and a non-bending area located at least on one side of the bending area. A density of the pixel electrodes in the bending area is less than that in the non-bending area, and a density of the color resist blocks in the bending area is less than that in the non-bending area.

18 Claims, 13 Drawing Sheets

(51) Int. Cl.
  *G02F 1/1339* (2006.01)
  *H01L 27/28* (2006.01)
  *G02F 1/1333* (2006.01)
  *G02F 1/1368* (2006.01)

(56) References Cited

U.S. PATENT DOCUMENTS

2017/0262022 A1\* 9/2017 Choi .................... G02B 5/3025
2019/0033628 A1\* 1/2019 Kawata ................. G02F 1/0107
2020/0249516 A1\* 8/2020 Tseng .................... G02F 1/1368

\* cited by examiner

DISPLAY PANEL AND PREPARATION METHOD THEREOF, AND DISPLAY APPARATUS

CROSS-REFERENCE TO RELATED APPLICATION

The present application claims the priority of the Chinese Patent Application No. 202011003986.X, filed to the CNIPA on Sep. 22, 2020, the content of which is hereby incorporated by reference.

TECHNICAL FIELD

Embodiments of the present disclosure relate to, but are not limited to, the field of display technology, and particularly relate to a display panel and a preparation method thereof, and a display apparatus.

BACKGROUND

Organic Liquid Crystal Display (OLCD) can be understood as flexible LCD, which is an implementation of flexible display technology. OLCD is based on flexible low-temperature Organic Thin Film Transistor (OTFT) technology, and uses plastics such as triacetate fiber (TAC) film or polymethyl methacrylate (PET) film as the substrate. Therefore, OLCD has better ductility, is slimmer, lighter and shatterproof, and can adapt to various surfaces. However, at present, the bent OLCD display apparatus has the problem of light leakage, which seriously affects the display quality.

SUMMARY

The following is a summary of subject matter described in detail herein. This summary is not intended to limit the protection scope of the claims.

An embodiment of the present disclosure provides a display panel, including an array substrate and a color filter substrate which are aligned and combined into a cell. The color filter substrate includes a first base substrate and a plurality of color resist blocks arranged at intervals on the first base substrate. The array substrate includes a second base substrate and a plurality of pixel electrodes arranged at intervals on the second base substrate. The pixel electrodes are in one-to-one correspondence with the color resist blocks. The display panel includes a bending area and a non-bending area located at least on one side of the bending area. A density of the pixel electrodes in the bending area is less than that in the non-bending area, and a density of the color resist blocks in the bending area is less than that in the non-bending area.

An embodiment of the present disclosure provides a display apparatus, including the display panel of the aforementioned embodiment.

An embodiment of the present disclosure provides a preparation method of a display panel, including:

forming a color filter substrate, wherein the color filter substrate includes a first base substrate and a plurality of color resist blocks arranged at intervals on the first base substrate, the color filter substrate includes a bending area and a non-bending area, and a density of the color resist blocks in the bending area is less than that in the non-bending area;

forming an array substrate, wherein the array substrate includes a first base substrate and a plurality of pixel electrodes arranged at intervals on the first base substrate, the array substrate includes a bending area and a non-bending area, and a density of the pixel electrodes in the bending area is less than that in the non-bending area; and aligning and combining the color filter substrate and the array substrate into a cell, wherein the color resist blocks are in one-to-one correspondence with the pixel electrodes.

Other aspects will become apparent upon reading and understanding accompanying drawings and the detailed description.

BRIEF DESCRIPTION OF DRAWINGS

The attached drawings are used to provide a further understanding of the technical scheme of the present disclosure, and constitute a part of the specification. They are used together with the embodiments of the present application to explain the technical scheme of the present disclosure, and do not constitute a restriction on the technical scheme of the present disclosure.

DETAILED DESCRIPTION

Figure 1:
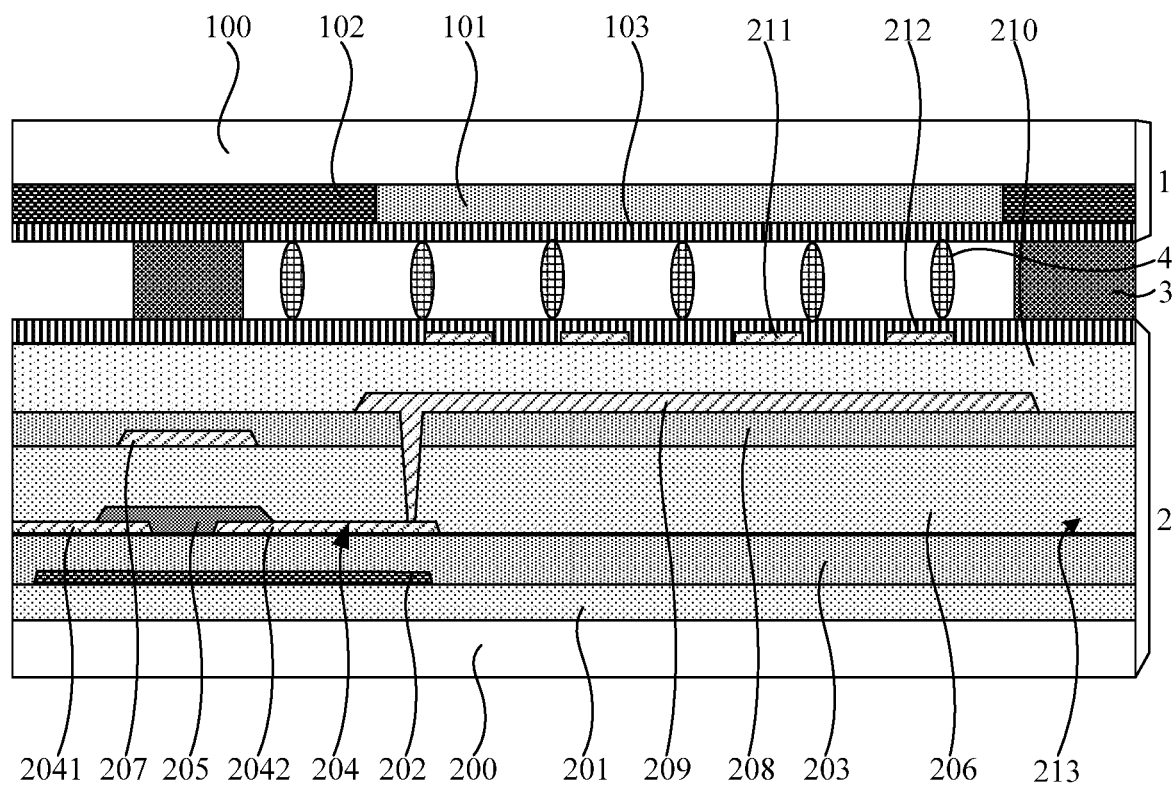
FIG. 1 is a structural diagram of an OLCD display panel.

To make the objects, technical solutions and advantages of the present disclosure more clear, embodiments of the present disclosure will be described in detail below with reference to the drawings. It should be noted that embodiments in the present disclosure and features in the embodiments may be combined with each other arbitrarily if there is no conflict.

To make the objects, technical solutions and advantages of the present disclosure more clear, embodiments of the present disclosure will be described in detail below with reference to the drawings. It should be noted that the embodiments may be implemented in a number of different forms. Those of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of constituent elements and thicknesses and areas of layers are sometimes exaggerated for clarity. Therefore, an implementation of the present disclosure is not necessarily limited to the sizes shown. The shapes and sizes of components in the drawings do not reflect true proportions. In addition, the drawings schematically show ideal examples, and an implementation of the present disclosure is not limited to the shapes or values shown in the drawings.

The ordinal numbers "first", "second", "third" and the like in the specification of the present disclosure are used to avoid confusion between constituent elements, but not to constitute limitations on quantities.

In the specification of the present disclosure, for sake of convenience, wordings such as "central", "upper", "lower", "front", "rear", "vertical", "horizontal", "top", "bottom", "inner", "outer" and the like describe the orientation or positional relations of constituent elements with reference to the drawings, which are only for ease of description of this specification and for simplification of the description, rather than indicating or implying that the apparatus or element referred to must have a specific orientation, or must be constructed and operated in a particular orientation, and therefore cannot be construed as limitations on the present disclosure. The positional relations of the constituent elements are appropriately changed according to the direction in which each constituent element is described. Therefore, they are not limited to the wordings in the specification, and may be replaced appropriately according to the situations.

In the specification of the present disclosure, terms "installed", "connected" and "coupled" shall be understood in a broad sense unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal connection between two elements. Those of ordinary skills in the art can understand the specific meanings of the above mentioned terms in the present disclosure according to specific context.

In the specification of the present disclosure, "parallel" refers to a state in which two straight lines form an angle between −10 degrees and 10 degrees and thus, includes a state in which the angle is between −5 degrees and 5 degrees. In addition, "vertical" refers to a state in which an angle formed by two straight lines is 80 degrees or more and 100 degrees or less, and thus includes a state in which the angle is 85 degrees or more and 95 degrees or less.

In the specification of the present disclosure, "film" and "layer" are interchangeable. For example, "conductive layer" may be replaced by "conductive film", or "insulating film" may be replaced by "insulating layer".

OLCD display panel is developed based on low-temperature Organic Thin Film Transistor (OTFT) technology. Compared with traditional LCD display panel, OLCD display panel can be supported by plastic TAC or PET instead of glass carrier plate, which enables it to be bent, and thus can be made into display apparatus with various curved surfaces.

FIG. 1 is a structural diagram of an OLCD display panel. As shown in FIG. 1, the OLCD display panel includes a color filter substrate 1 and an array substrate 2 which are aligned and combined into a cell, a liquid crystal cell is formed between the array substrate 2 and the color filter substrate 1 through spacer columns 3, and liquid crystal molecules 4 are filled in the liquid crystal cell. The color filter substrate 1 includes a first substrate 100, color resist blocks 101 arranged at intervals on the first substrate 100, a black matrix 102 arranged between the color resist blocks 101, and a first alignment layer 103 covering the color resist blocks 101 and the black matrix 102. The color resist blocks 101 include red, blue and green color resist blocks, which are arranged periodically. The array substrate 2 includes a second substrate 200, and a polarizing layer 201, a light shielding layer 202, a first insulating layer 203, a source-drain metal layer 204, an active layer 205, a second insulating layer 206, a gate metal layer 207, a third insulating layer 208, pixel electrodes 209, a fourth insulating layer 210, common electrodes 211 and a second alignment layer 212 covering the common electrodes 211, which are sequentially arranged on the second substrate 200. The active layer 205 corresponds to the light shielding layer 202 in position, and an orthographic projection of the active layer 205 on the second substrate 200 lies within a range of an orthographic projection of the light shielding layer 202 on the second substrate 200. The source-drain metal layer 204 includes source electrodes 2041 and drain electrodes 2042, the drain electrodes 2042 are connected with the pixel electrodes 209 through via holes penetrating through the second insulating layer 206 and the third insulating layer 208, and the second insulating layer 206 and the third insulating layer 208 in the via hole are etched away. The gate metal layer 207 includes gates and gate connection electrodes. The common electrodes 211 correspond to the pixel electrodes 209 in position, and the common electrode 211 is a slit electrode. After applied with voltage, the pixel electrodes 209 and the common electrodes 211 form a horizontal electric field that drives the liquid crystal molecules 4 to deflect. The light shielding layer 202, the first insulating layer 203, the source-drain metal layer 204, the active layer 205, the second insulating layer 206, the gate metal layer 207 and the third insulating layer 208 form an array structure layer 213, and the active layer 205, the source electrode 2041, the drain electrode 2042 and the gate form an organic thin film transistor. Since both the first substrate 100 and the second substrate 200 are flexible substrates, both the color filter substrate 1 and the array substrate 2 can be bent. In an example, the materials of the first substrate 100 and the second substrate 200 may be TAC or PET. The active layer may be made of an organic material, such as 3-hexylthiophene, polyfluorene-based polymer or polythiophene.

Figure 2:
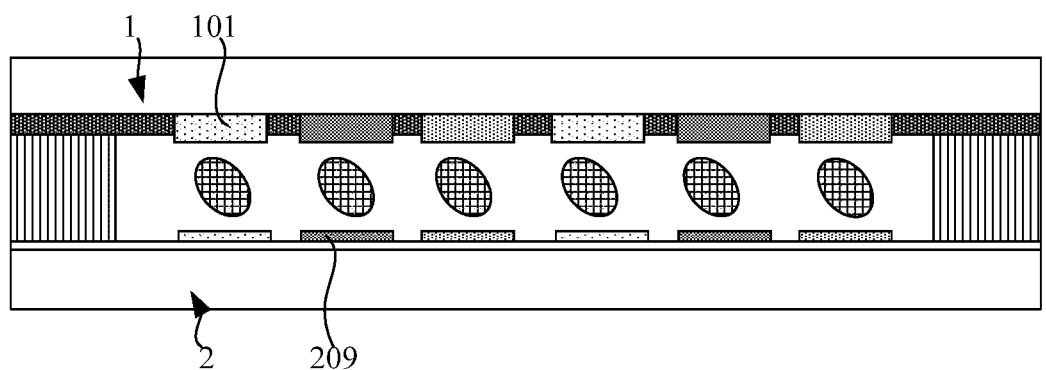
FIG. 2 is a schematic structural diagram of a liquid crystal display panel.
Figure 3:
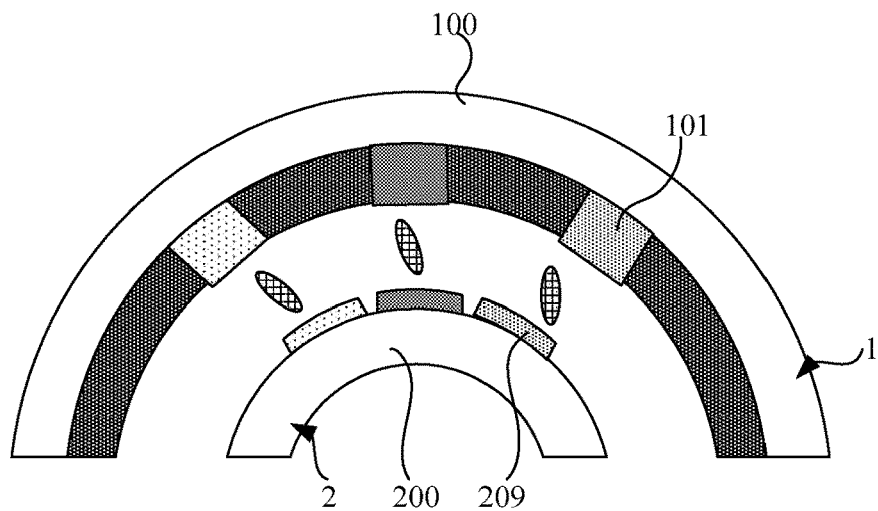
FIG. 3 is a schematic structural diagram of a bent OLCD display panel.

FIG. 2 is a schematic structural diagram of a liquid crystal display panel. As shown in FIG. 2, the LCD display panel is not bent after the process of aligning and combining into a cell is completed, and the color resist blocks 101 on the color filter substrate 1 may be completely in one-to-one correspondence with the pixel electrodes 209 on the array substrate 2. When the data voltage is input to each pixel electrode 209 through the drain electrode, the control over the liquid crystal in the corresponding area may be achieved. FIG. 3 is a schematic structural diagram of a bent OLCD display panel. As shown in FIG. 3, after the OLCD display panel is bent outwards, in the bending area, the length of the first substrate 100 becomes longer because it is stretched, and the length of the second substrate 200 becomes shorter because it is compressed. The deformation of the first substrate 100 of the color filter substrate 1 is different from that of the second substrate 200 of the array substrate 2. As the first substrate 100 becomes longer, the density of the color resist blocks 101 in the bending area becomes smaller and the spacing between the color resist blocks 101 becomes larger. As the second substrate 200 becomes shorter, the density of the pixel electrodes 209 in the bending area becomes larger, and the spacing between the pixel electrodes 209 becomes smaller, which leads to the misalignment of the color resist blocks and the corresponding pixel electrodes in the bending area and the uneven thickness of the liquid crystal cell.

Figure 4:
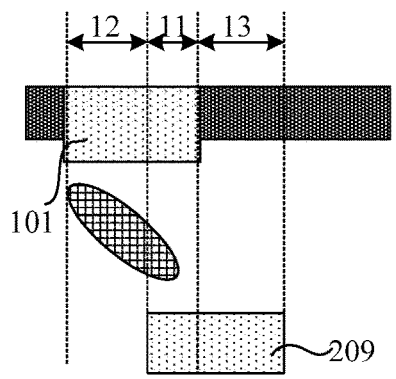
FIG. 4 is a schematic diagram of a structure of problem one after an OLCD display panel is bent.
Figure 5:
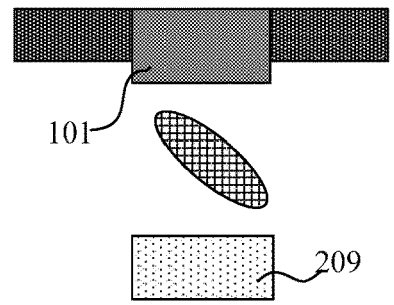
FIG. 5 is a schematic diagram of a structure of problem two after an OLCD display panel is bent.

As shown in FIG. 4, after the OLCD display panel is bent, the color resist blocks 101 are partially misaligned with the corresponding pixel electrodes 209. There are a corresponding area 11 and a non-corresponding area between the color resist blocks 101 and the pixel electrodes 209. The non-corresponding area includes a first non-corresponding area 12 corresponding to the color resist blocks 101 and a second non-corresponding area 13 corresponding to the pixel electrodes 209. Since horizontal electric field does not act on the first non-corresponding area 12, the liquid crystal deflection cannot be controlled in the first non-corresponding area 12, and thus the light emitted from the back light source to this area cannot be controlled, thereby leading to light leakage. In addition, the area of the corresponding area 11 is reduced due to the misalignment between the color resist blocks 101 and the corresponding pixel electrodes 209, resulting in a decrease in the aperture ratio of the pixel. In an example, after the OLCD display panel is bent, it may happen that the color resist blocks 101 are completely misaligned with the corresponding pixel electrodes 209, as shown in FIG. 5, in which the same filling pattern of the color resist block 101 and the pixel electrode 209 indicates that there is a corresponding relationship, while the pixel electrode 209 corresponding to the color resist block 101 in FIG. 5 corresponds to the adjacent color resist block 101, resulting in display errors.

Figure 6:
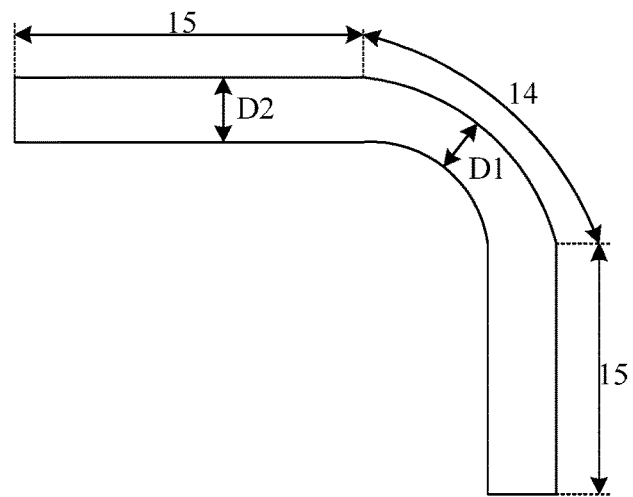
FIG. 6 is a schematic diagram of a structure of problem three after an OLCD display panel is bent.

FIG. 6 is a schematic structural diagram of uneven thickness of a liquid crystal cell after an OLCD display panel is bent. As shown in FIG. 6, the bending area 14 of the OLCD display panel is deformed by bending, and the thickness D1 of the liquid crystal cell in the bending area 14 is less than the thickness D2 of the liquid crystal cell in the non-bending area 15, which leads to the difference in brightness and other characteristics of the display screen between the bending area 14 and the non-bending area 15, thereby causing the overall display effect to decrease. The thickness of the liquid crystal cell refers to the distance between the color filter substrate and the array substrate.

An embodiment of the present disclosure provides a display panel, including an array substrate and a color filter substrate which are aligned and combined into a cell. The color filter substrate includes a first base substrate and a plurality of color resist blocks arranged at intervals on the first base substrate. The array substrate includes a second base substrate and a plurality of pixel electrodes arranged at intervals on the second base substrate. The pixel electrodes are in one-to-one correspondence with the color resist blocks. The display panel includes a bending area and a non-bending area located at least on one side of the bending area. A density of the pixel electrodes in the bending area is less than that in the non-bending area, and a density of the color resist blocks in the bending area is less than that in the non-bending area.

In an embodiment of the present disclosure, by arranging the density of the pixel electrodes in the bending area to be less than that in the non-bending area in the display panel, and arranging the density of the color resist blocks in the bending area to be less than that in the non-bending area in the display panel, light leakage caused by the misalignment of the pixel electrodes and the color resist blocks in the bending area is prevented, thereby improving the display quality of the display panel. According to the density of the pixel electrodes, the number of the pixel electrodes per unit area may be specified, and according to the density of the color resist blocks, the number of the color resist blocks per unit area may be specified.

The technical solution of the embodiments of the present disclosure is exemplarily illustrated below with reference to the accompanying drawings.

Figure 7A:
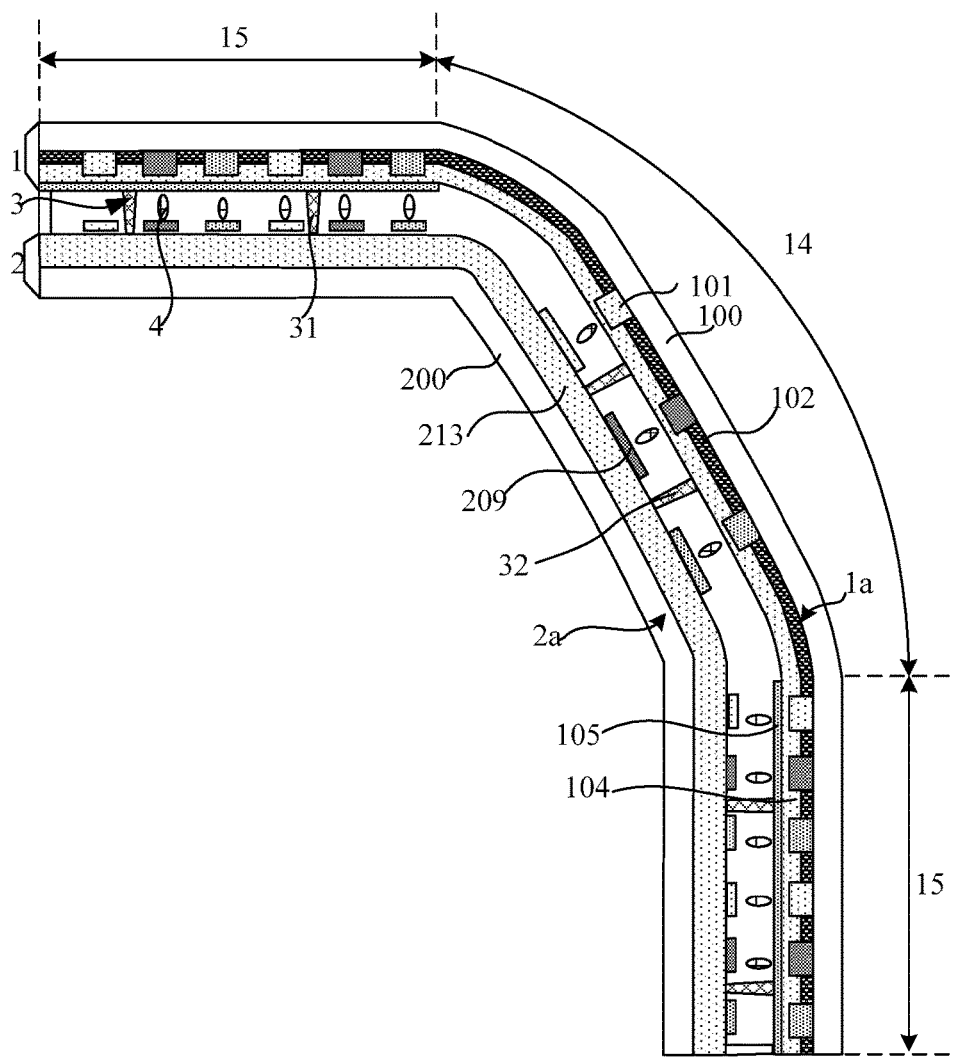
FIG. 7A is a sectional structural diagram of a display panel according to an embodiment of the present disclosure.
Figure 7B:
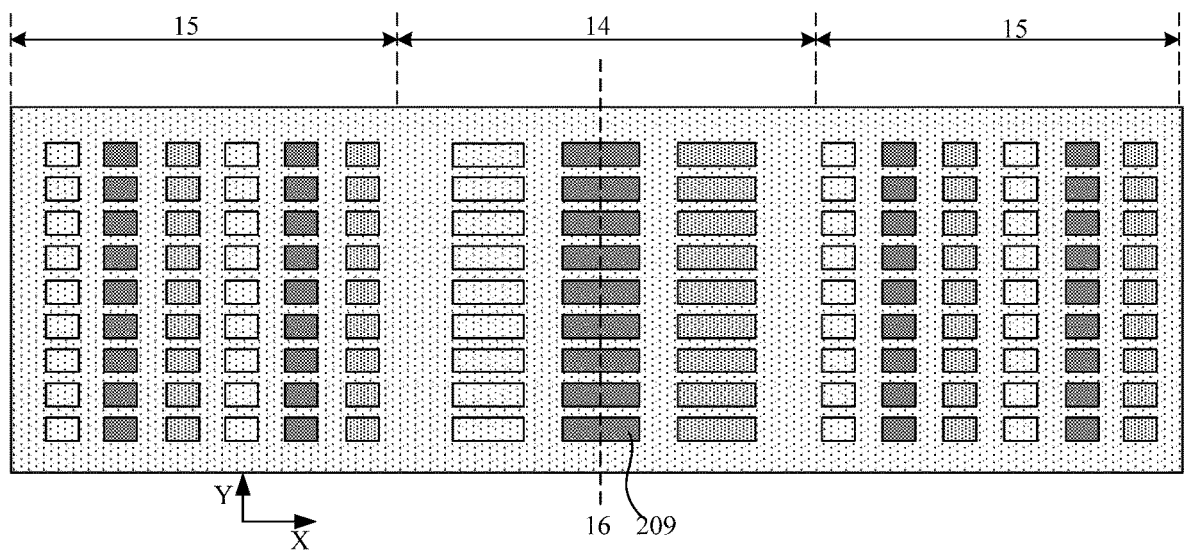
FIG. 7B is a schematic plane view of a structure of an array substrate according to an embodiment of the present disclosure.
Figure 7C:
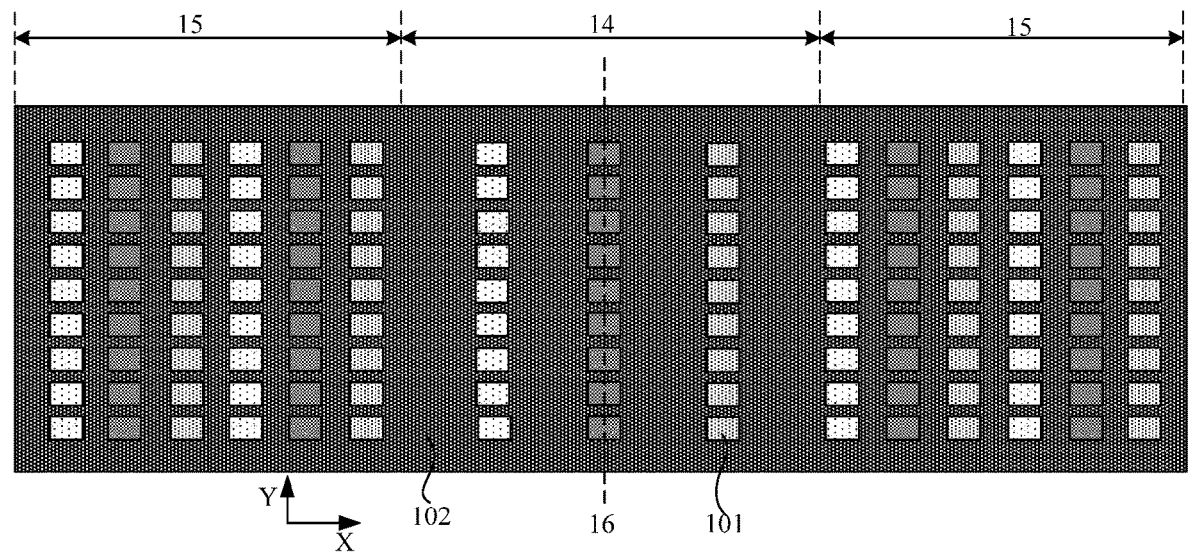
FIG. 7C is a schematic plan view of a structure of a color filter substrate according to an embodiment of the present disclosure.
Figure 8:
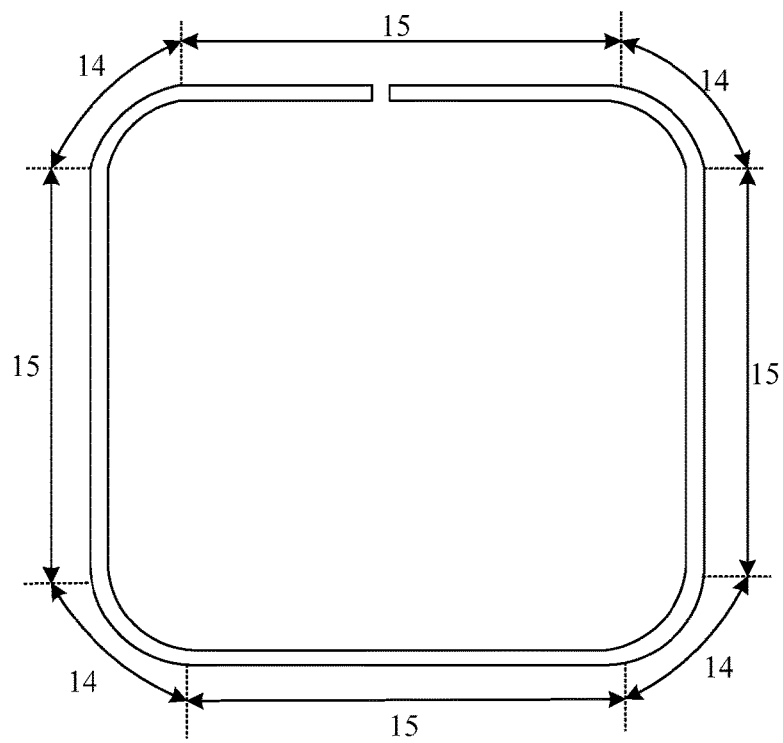
FIG. 8 is a structural diagram of a display panel according to an exemplary embodiment of the present disclosure.

FIG. 7A is a sectional structure diagram of a display panel according to an embodiment of the present disclosure, FIG. 7B is a schematic plane view of a structure of an array substrate according to an embodiment of the present disclosure, and FIG. 7C is a schematic plan view of a structure of a color filter substrate according to an embodiment of the present disclosure. As shown in FIGS. 7A, 7B and 7C, the display panel includes a color filter substrate 1 and an array substrate 2 which are aligned and combined into a cell. A plurality of spacer columns 3 are arranged between the array substrate 2 and the color filter substrate 1. A liquid crystal layer is formed between the array substrate 2 and the color filter substrate 1. The liquid crystal layer includes liquid crystal molecules 4. In an example, the liquid crystal molecules may be self-aligned liquid crystal. The color filter substrate 1 includes a first base substrate 1a and a plurality of color resist blocks 101 arranged at intervals on the first base substrate 1a. The array substrate 2 includes a second base substrate 2a and a plurality of pixel electrodes 209 arranged at intervals on the second base substrate 2a. The pixel electrodes 209 are in one-to-one correspondence with the color resist blocks 101. The display panel includes a bending area 14 and a non-bending area 15 located at least on one side of the bending area 14. A density of the pixel electrodes 209 in the bending area 14 is less than that in the non-bending area 15, and a density of the color resist blocks 101 in the bending area 14 is less than that in the non-bending area 15. In an example, there may be two non-bending areas 15, one is on a first side of the bending area 14 and the other is on a second side of the bending area 14 opposite to the first side. In an example, as shown in FIG. 8, the display panel is enclosed into a rectangular structure. The display panel includes bending areas 14 located at four corners of the rectangular structure and non-bending areas 15 connecting adjacent bending areas 14. FIG. 8 is a structural diagram of a display panel according to an exemplary embodiment of the present disclosure.

In an exemplary embodiment, as shown in FIG. 7A, the first base substrate 1a may include a first substrate 100 and a black matrix 102 arranged on the first substrate 100 and between adjacent color resist blocks 101.

In an exemplary embodiment, as shown in FIG. 7A, the second base substrate 2a may include a second substrate 200 and an array structure layer 213 arranged on the second substrate 200. The array structure layer 213 includes organic thin film transistors, and the pixel electrodes 209 are connected with the drain electrodes of the organic thin film transistors.

In an embodiment of the present disclosure, by arranging the density of the pixel electrodes 209 in the bending area 14 to be less than that in the non-bending area in the display panel, and arranging the density of the color resist blocks 101 in the bending area 14 to be less than that in the non-bending area 15 in the display panel, light leakage caused by the misalignment between the pixel electrodes 209 and the color resist blocks 101 in the bending area 14 is prevented, thereby improving the display quality of the display panel.

In an exemplary embodiment, as shown in FIG. 7B, in a direction perpendicular to a bending axis 16 of the bending area 14, a length of the pixel electrodes 209 in the bending area 14 is longer than that of the color resist blocks 101 in the bending area 14, and the bending axis 16 is located in the bending area 14. In an example, the bending axis 16 may be a center line of the display panel during bending, and the display panels on both sides of the center line may be bent with the center line as the axis. The direction perpendicular to the bending axis 16 of the bending area 14 refers to the direction perpendicular to the bending axis 16 and parallel to the plane where the first substrate is located before being bent. The plane where the first substrate is located before being bent refers to the plane where the side of the first substrate facing the color resist block is located before the first substrate is bent. After bending, an orthographic projection of the color resist block 101 of the bending area 14 on the second base substrate lies within a range of an orthographic projection of the pixel electrode 209 of the bending area 14 corresponding to the color resist block 101 on the second base substrate. By arranging a length of the pixel electrodes 209 in the bending area 14 to be larger than a length of the color resist block 101 in the bending area 14, even if the bending area 14 of the first base substrate is stretched after being bent, resulting in a larger spacing between the color resist blocks 101, however since the length of the pixel electrode 209 in the direction perpendicular to the bending axis 16 is larger than the length of the color resist block 101, after being bent, the orthographic projections of the pixel electrodes 209 of the bending area 14 on the second base substrate may effectively cover the orthographic projections of the color resist blocks 101 of the bending area 14 on the second base substrate, so that the color resist blocks 101 of the bending area 14 correspond to the pixel electrodes 209 of the bending area 14, thereby preventing the color resist blocks 101 from being misaligned with the pixel electrodes 209. In an example, in the direction perpendicular to the bending axis 16 of the bending area 14, a length of the pixel electrodes 209 in the non-bending area 15 is less than that in the bending area 14. In the direction parallel to the bending axis 16 of the bending area, a width of the pixel electrodes 209 in the non-bending area 15 is equal to that in the bending area 14. The direction parallel to the bending axis 16 of the bending zone 14 refers to the direction parallel to the bending axis 16 and parallel to the plane where the first substrate is located before bending, that is, Y direction shown in FIG. 7B. In an example, in the direction perpendicular to the bending axis 16 of the bending area 14, a length of the color resist block 101 in the non-bending area 15 is equal to a length of the pixel electrodes 209 in the bending area 14. In the direction parallel to the bending axis 16 of the bending area, a width of the color resist block 101 in the non-bending area 15 is equal to a width of the color resist block 101 in the bending area 14. In an example, in the direction perpendicular to the bending axis 16, the length of the pixel electrodes 209 in the bending area 14 may be 30 microns to 400 microns, and the length of the color resist block 101 in the bending area 14 may be 20 microns to 200 microns. In an example, the length of the pixel electrodes 209 in the bending area 14 may be 1.5 to 2 times of the length of the color resist blocks 101 in the bending area 14.

In an exemplary embodiment, as shown in FIGS. 7B and 7C, in the direction parallel to the bending axis 16 of the bending area 14, the spacing between adjacent pixel electrodes 209 in the bending area 14 is equal to the spacing between adjacent pixel electrodes 209 in the non-bending area 15, and the spacing between adjacent color resist blocks 101 in the bending area 14 is equal to the spacing between adjacent color resist blocks 101 in the non-bending area 15.

In the direction perpendicular to the bending axis 16 of the bending area 14, the spacing between adjacent pixel electrodes 209 in the bending area 14 is larger than the spacing between adjacent pixel electrodes 209 in the non-bending area 15, and the spacing between adjacent color resist blocks 101 in the bending area 14 is larger than the spacing between adjacent color resist blocks 101 in the non-bending area 15.

In an exemplary embodiment, as shown in FIG. 7A, the color filter substrate 1 further includes a flat layer 104 covering the color resist block 101 and a spacer layer 105 arranged on the flat layer 104. The spacer layer 105 is located in the non-bending area 15. A plurality of spacer columns 3 include first spacer columns 31 supported between the spacer layer 105 and the second base substrate 2a and second spacer columns 32 supported between the flat layer 104 and the second base substrate 2a. The first spacer column 31 and the second spacer column 32 have the same size and structure. The spacer layer 105 is arranged in the non-bending area 15, but not arranged in the bending area 14. Before the display panel is bent, a thickness of the liquid crystal cell in the bending area 14 is larger than that in the non-bending area 15. The thickness of the liquid crystal cell refers to the width of the liquid crystal cell in the direction perpendicular to the first base substrate or the second base substrate. After the display panel is bent, the thickness of the liquid crystal cell in the bending area 14 decreases. However, the spacer layer 105 is arranged in the non-bending area 15, which may balance the thickness of the liquid crystal cells in the bending area 14 and the non-bending area 15, thus ensuring the display uniformity between the bending area 14 and the non-bending area 15 and improving the overall display effect of the display panel. In an example, the thickness of the spacer layer 105 may be determined according to the bending radius of the display panel and the strain conditions of the first base substrate 1a and the second base substrate 2a in the bending area 14. For example, the thickness of the spacer layer may be 0.1 microns to 2 microns. The spacer layer 105 may be made of a transparent material, for example, photoresist.

Figure 9A:
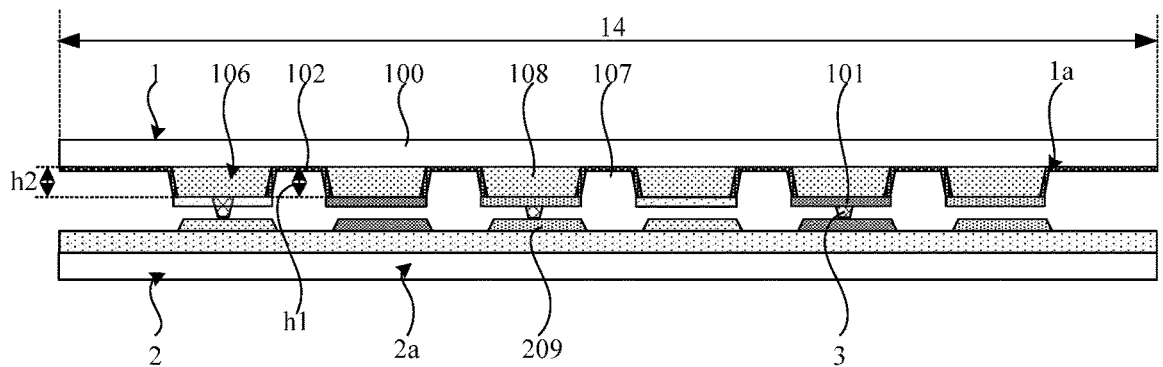
FIG. 9A is a schematic diagram of another display panel according to an exemplary embodiment of the present disclosure.
Figure 9B:
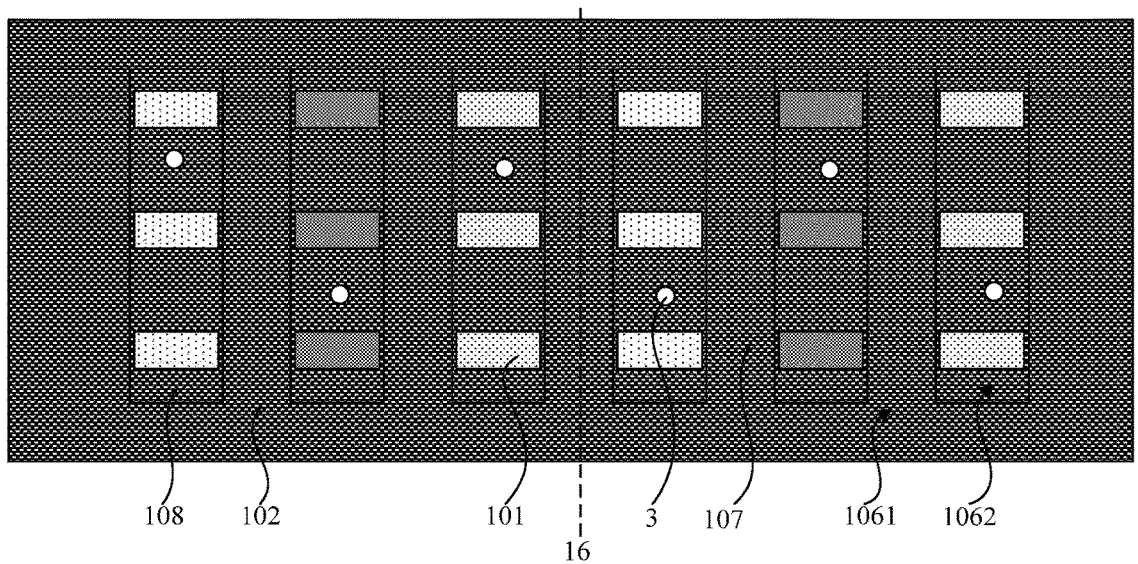
FIG. 9B is a structural diagram of the color filter substrate in FIG. 9A.

FIG. 9A is a structural diagram of another display panel according to an exemplary embodiment of the present disclosure, and FIG. 9B is a structural diagram of the color filter substrate in FIG. 9A. In another exemplary embodiment, as shown in FIG. 9A and FIG. 9B, in the bending area 14 of the display panel, the color filter substrate 1 further includes a strain layer 106 arranged on the first substrate 100. The strain layer 106 includes a first strain region 1061 and a second strain region 1062. A tensile modulus of the first strain region 1061 is less than that of the second strain region 1062. The black matrix 102 covers the first strain region 1061, and the color resist block 101 is arranged in the second strain region 1062. The first strain region 1061 has a small tensile modulus, that is, as a weak tensile region, and the second strain region 1062 has a large tensile modulus, that is, as a strong tensile region. In the bending process of the display panel, the strain mainly occurs in the weak tensile region. In the bending process, the black matrix 102 is greatly deformed, and the color resist block 101 is basically not deformed, thereby preventing the color resist blocks 101 from being misaligned with the pixel electrodes 209 in a large range. In addition, after the black matrix 102 is stretched and deformed, the light shielding area thereof covers a larger area, which effectively prevents light leakage caused by the misalignment between the color resist blocks 101 and the pixel electrodes 209. In an example, a similar design may be made for the non-bending area 15. For example, the strain layer 106 is formed in the non-bending area 15 of the display panel. In an example, the strain layer 106 may not be formed in the non-bending area 15.

In an exemplary embodiment, as shown in FIGS. 9A and 9B, the first strain region 1061 includes a plurality of first strain grooves 107 extending in a direction parallel to the bending axis 16 and arranged at intervals in a direction perpendicular to the bending axis 16. The second strain region 1062 includes a pixel ribs 108 formed between adjacent first strain grooves 107. The black matrix 102 covers the first strain grooves 107 and the pixel ribs 108 except the position corresponding to the color resist blocks 101. In the direction perpendicular to the first substrate 100, a depth h1 of the first strain grooves 107 may be less than or equal to a thickness h2 of the strain layer 106. The thickness of the strain layer 106 may be 5 microns to 30 microns, and the depth of the first strain groove 107 may be 5 microns to 30 microns. A cross section of the first strain groove 107 may be trapezoidal, and the side of the first strain groove 107 facing the first substrate 100 is narrower than the side away from the first substrate 100. Since the strain layer 106 in the first strain groove 107 is partially or completely removed, the tensile modulus of the first base substrate 1a at the position of the first strain groove 107 is less than that of the first base substrate 1a at the position of the pixel ribs 108. Therefore, in the bending process of the display panel, the strain mainly occurs at the position of the first strain grooves 107. For example, the strain mainly occurs on the black matrix 102, while the strain of the color resist block 101 is very small. The spacer column 3 may be arranged on the pixel rib 108 and between adjacent color resist blocks 101, that is, arranged in the second strain region 1062. Since the strain in the second strain region 1062 is small, the offset of the spacer column 3 is small, thereby reducing the risk of the spacer column 2 out of position scratching the display area of the array substrate during the bending process of the display panel. In this exemplary embodiment, the display panel may be adapted to be bent in one direction with the bending axis 16 as the axis.

Figure 10A:
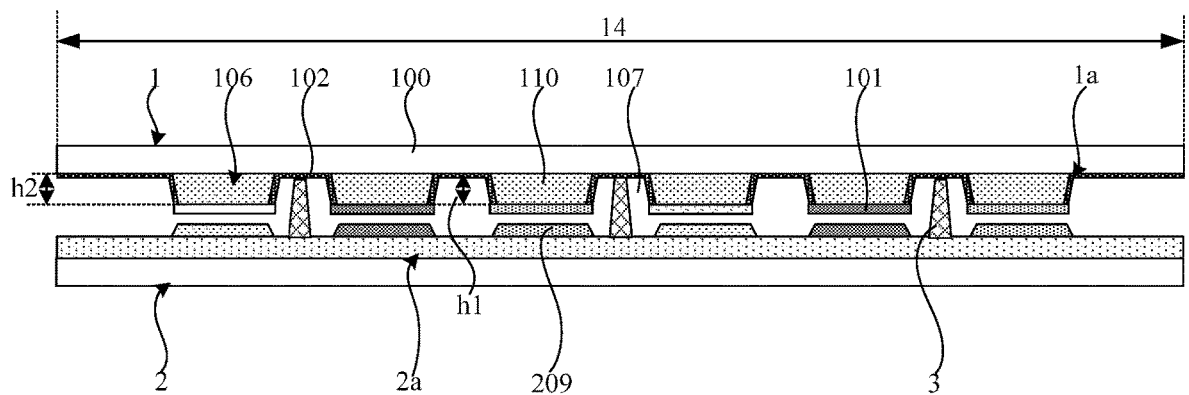
FIG. 10A is a structural diagram of another display panel according to an exemplary embodiment of the present disclosure.
Figure 10B:
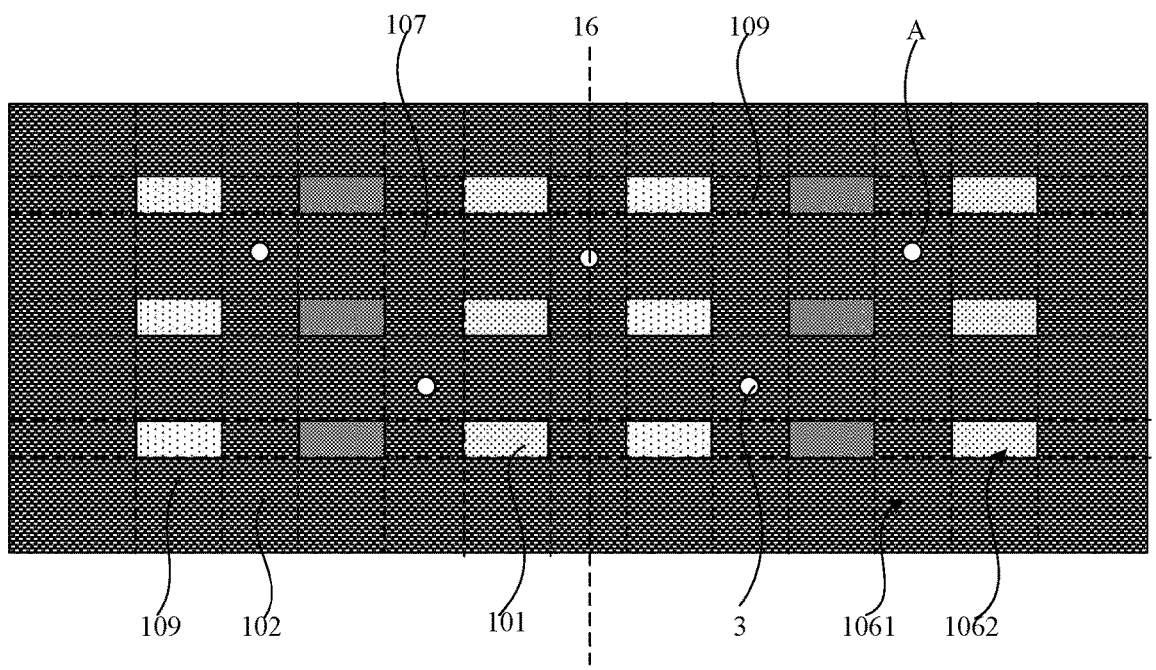
FIG. 10B is a structural diagram of the color filter substrate in FIG. 10A.

FIG. 10A is a structural diagram of another display panel according to an exemplary embodiment of the present disclosure, and FIG. 10B is a structural diagram of the color filter substrate in FIG. 10A. In another exemplary embodiment, as shown in FIGS. 10A and 10B, in the bending area 14 of the display panel, the first strain region 1061 further includes a plurality of second strain grooves 109 extending in a direction perpendicular to the bending axis 16 and arranged at intervals in a direction parallel to the bending axis 16. The first strain grooves 107 and the second strain grooves 109 may be interconnected. The second strain region 1062 includes pixel islands 110 formed between the first strain grooves 107 and the second strain grooves 109, and the color resist block 101 is located on a surface of the pixel island 110 close to the array substrate 2. The black matrix 102 covers the first strain groove 107 and the second strain groove 109. In the direction perpendicular to the first substrate 100, the depth of the second strain groove 109 may be less than or equal to the thickness of the strain layer 106. The thickness of the strain layer may range from 5 microns to 30 microns, and the depth of the second strain groove 109 may range from 5 microns to 30 microns. The cross section of the second strain groove 109 may be trapezoidal, and the side of the second strain groove 109 facing the first substrate 100 is narrower than the side away from the first substrate 100. Since the strain layer 106 in the second strain groove 109 is partially or completely removed, the tensile modulus of the first base substrate 1a at the second strain groove 109 is less than that of the first base substrate 1a at the pixel islands 110. Therefore, in the bending process of the display panel, the strain mainly occurs at the position of the first strain groove 107 and the second strain groove 109. For example, the strain mainly occurs on the black matrix 102, while the deformation of the color resist block 101 is very small. The spacer columns 3 may be arranged in the first strain grooves 107 or in the second strain grooves 109 or at interconnection positions between the first strain grooves 107 and the second strain grooves 109. In an example, the interconnection position is as specified by "A" in FIG. 10B. The spacer column 3 is arranged in the first strain groove 107 or the second strain groove 109, which may effectively reduce the risk of light leakage caused by the spacer column 3 scratching the display area of the array substrate during the bending. In this exemplary embodiment, since the pixel islands are completely independent, the display panel may be bent from any axis (for example, at least including the bending axis 16 and the direction perpendicular to the bending axis 16), and the deformation of the black matrix 102 during bending may prevent light leakage and misalignment.

Next, the structure of the display panel according to an embodiment of the present disclosure will be explained by an example of the preparation process of the display panel. The "patterning process" mentioned in the present disclosure includes processes such as film layer deposition, photoresist coating, mask exposure, development, etching, and photoresist stripping. The deposition may be selected as any one or more of sputtering, evaporation and chemical vapor deposition, the coating may be selected as any one or more of spraying and spin coating, and etching may be selected as any one or more of dry etching and wet etching. A "thin film" refers to a layer of thin film manufactured from a certain material on a base substrate by using deposition or coating process. If the "thin film" does not need a patterning process during the whole manufacturing process, the "thin film" may also be called a "layer". When the "thin film" needs a patterning process during the whole manufacturing process, it is called "thin film" before the patterning process and called "layer" after the patterning process. The "layer" after the patterning process contains at least one "pattern". In the embodiments of the present disclosure, "A and B are arranged on the same layer" means that A and B are formed simultaneously by the same patterning process. "An orthographic projection of A includes an orthographic projection of B" means that the orthographic projection of B falls within a range of the orthographic projection of A, or the orthographic projection of A covers the orthographic projection of B.

The preparation process of the display panel according to an embodiment of the present disclosure may include preparation of an array substrate, preparation of a color filter substrate, process of aligning and combining into a cell, and process of bending. The preparation processes of the array substrate and the color filter substrate are not prioritized. They may be performed simultaneously, or the color filter substrate may be prepared first and then the array substrate is prepared, or the array substrate may be prepared first and then the color filter substrate is prepared, which is not limited in this example.

An embodiment of the present disclosure provides a preparation method of a display panel, including:

forming a color filter substrate and an array substrate; and aligning and combining the color filter substrate and the array substrate into a cell.

Further, forming the color filter substrate may include:

(1) Coating a first substrate film on a glass carrier plate 5, and after curing to form a film, forming a first substrate 100.

In an exemplary embodiment, a material of the first substrate 100 may include polyimide, triacetate (TAC) or polymethylmethacrylate (PET).

(2) Coating a black matrix film on the first substrate 100, and patterning the black matrix film by a patterning process.

Figure 11A:
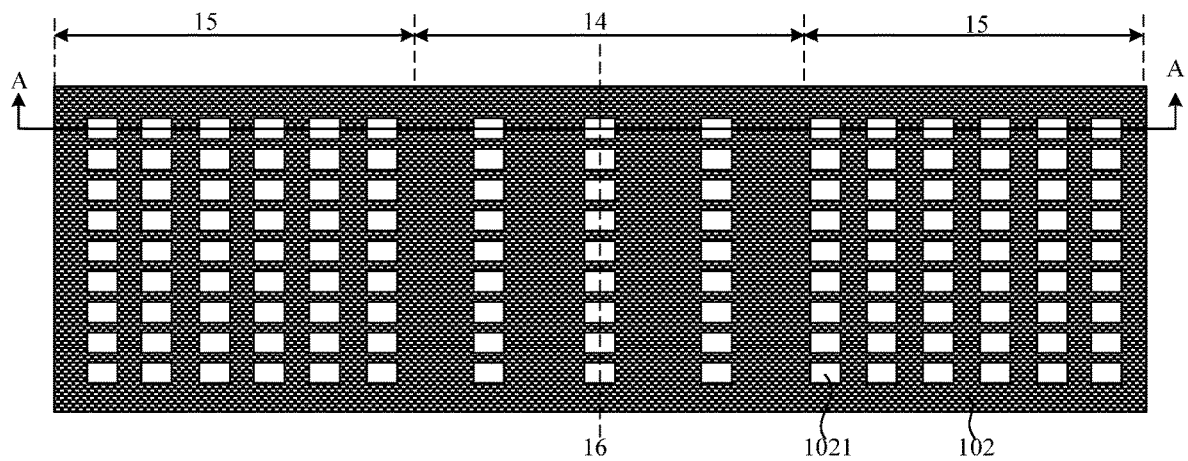
FIG. 11A is a plan view after formation of a black matrix according to an exemplary embodiment of the present disclosure.
Figure 11B:
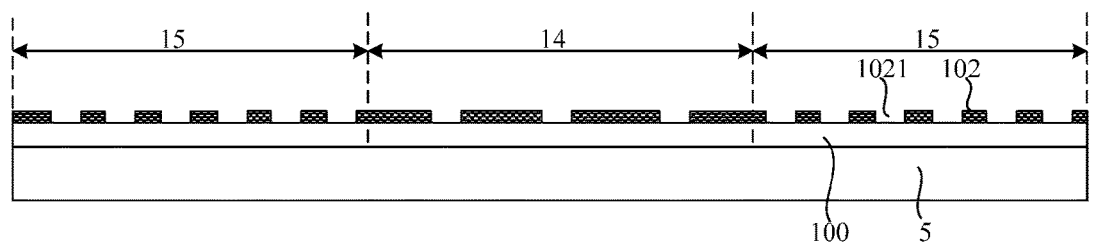
FIG. 11B is a sectional view at the position A-A in FIG. 11A.

In an exemplary embodiment, as shown in FIGS. 11A and 11B, a pattern of the black matrix 102 is formed. The black matrix 102 includes a plurality of pixel openings 1021 arranged in an array. A density of the pixel openings 1021 in the bending area 14 is less than that in the non-bending area 15. The density of the pixel openings 1021 refers to the number of the pixel openings 1021 per unit area. In an example, in the direction perpendicular to the bending axis 16, a length of the pixel opening 1021 in the bending area 14 is equal to that in the non-bending area 15, and the spacing between the pixel openings 1021 in the bending area 14 is larger than that in the non-bending area 15. In the direction parallel to the bending axis 16, a width of the pixel opening 1021 in the bending area 14 is equal to that in the non-bending area 15, and the spacing between the pixel openings 1021 in the bending area 14 is equal to that in the non-bending area 15. FIG. 11A is a plan view after formation of a black matrix according to an exemplary embodiment of the present disclosure; and FIG. 11B is a sectional view at the position A-A in FIG. 11A.

(3) Coating a color resist film on the substrate with the aforementioned pattern formed thereon, masking, exposing and developing to form a pattern of color resist blocks 101 covering the pixel openings.

Figure 12A:
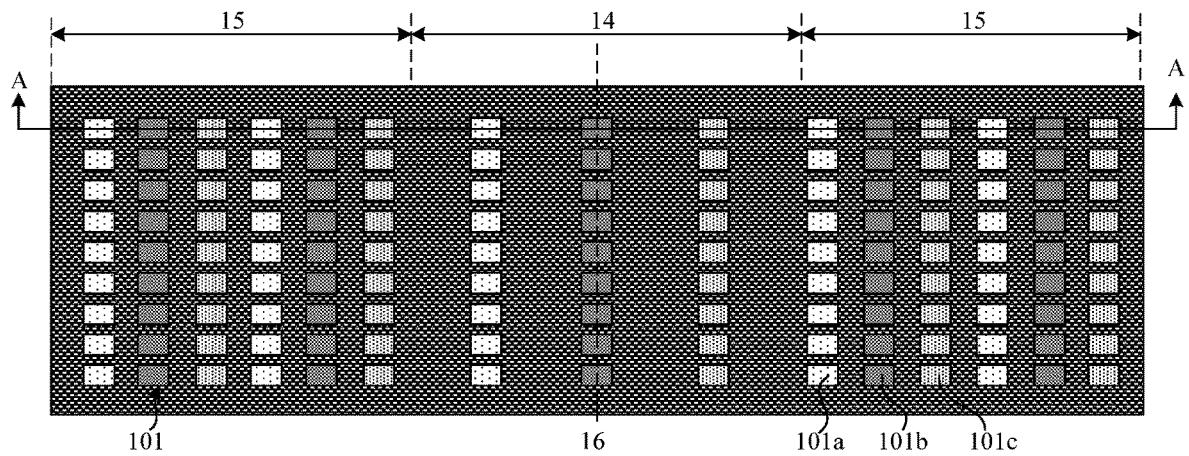
FIG. 12A is a plan view after formation of color resist blocks according to an exemplary embodiment of the present disclosure.
Figure 12B:
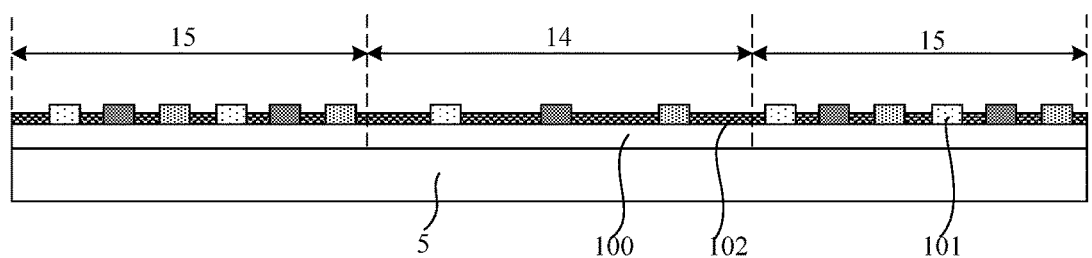
FIG. 12B is a sectional view at the position A-A in FIG. 12A.

In an exemplary embodiment, as shown in FIGS. 12A and 12B, the color resist blocks 101 may include one or more of red color resist blocks 101a, blue color resist blocks 101b, green color resist blocks 101c and transparent color resist blocks (white color resist blocks). The color resist blocks 101 are arranged in multiple rows and columns. In an example, the color resist blocks 101 in the same column have the same color, and in any three adjacent columns there are red color resist blocks 101a, blue color resist blocks 101b and green color resist blocks 101c. Since the density of the pixel openings in the bending area 14 is less than that in the non-bending area 15, the density of the color resist blocks 101 in the bending area 14 is less than that in the non-bending area 15. In an example, in the direction perpendicular to the bending axis 16, the length of the color resist block 101 in the bending area 14 is equal to that in the non-bending area 15, and the spacing between the color resist blocks 101 in the bending area 14 is larger than that in the non-bending area 15. In the direction parallel to the bending axis 16, the width of the color resist block 101 in the bending area 14 is equal to that in the non-bending area 15, and the spacing between the color resist blocks 101 in the bending area 14 is equal to that in the non-bending area 15. FIG. 12A is a plan view after formation of color resist blocks according to an exemplary embodiment of the present disclosure; FIG. 12B is a sectional view at the position A-A in FIG. 12A.

(4) Coating a flat film on the substrate with the aforementioned pattern formed thereon to form a flat layer 104.

Figure 13:
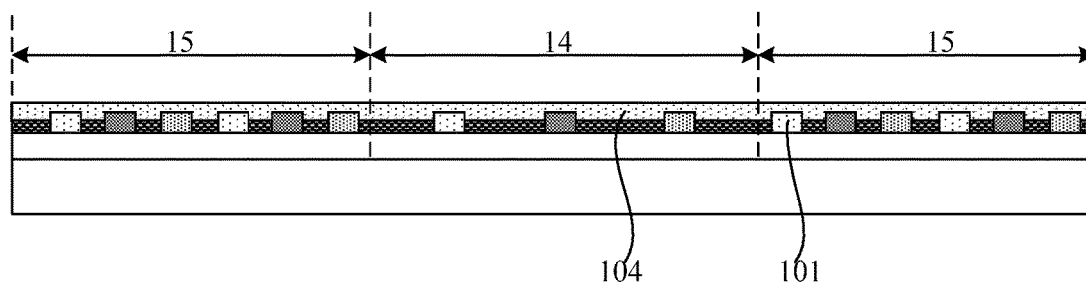
FIG. 13 is a structural diagram after formation of a flat layer according to an exemplary embodiment of the present disclosure.

In an exemplary embodiment, as shown in FIG. 13, the flat layer 104 covers the color resist block 101 and the black matrix 102. In an example, the material of the flat layer 104 may be polyimide or polymethylmethacrylate, etc., and the flat layer may be a light-transmitting layer. FIG. 13 is a structural diagram after formation of a flat layer according to an exemplary embodiment of the present disclosure.

(5) Coating a spacer layer film on the flat layer, masking, exposing and developing to form a pattern of a spacer layer 105.

Figure 14:
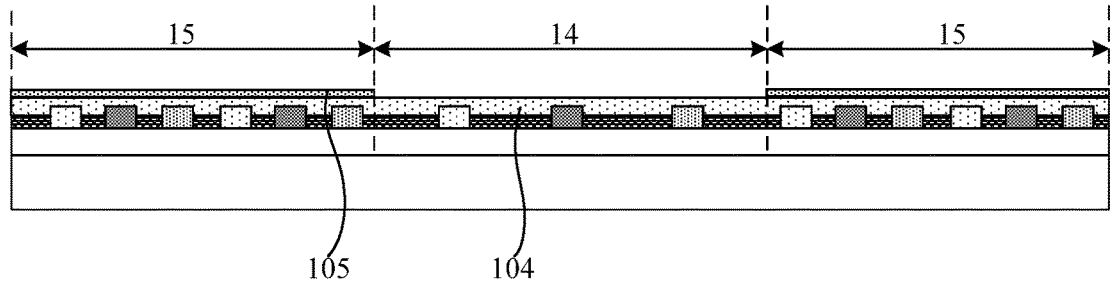
FIG. 14 is a structural diagram after formation of a spacer layer according to an exemplary embodiment of the present disclosure.

In an exemplary embodiment, as shown in FIG. 14, the spacer layer 105 is formed in the non-bending area 15. The film-layer structure in the bending area 14 does not include the spacer layer 105, and there is a step difference between the non-bending area 15 and the bending area 14. The thickness of the spacer layer 105 may be 0.1 microns to 2 microns. The material of the spacer layer 105 may be the same as that of the flat layer. FIG. 14 is a structural diagram after formation of a spacer layer according to an exemplary embodiment of the present disclosure.

After the above steps, the preparation of a color filter substrate according to an exemplary embodiment of the present disclosure is completed. The first substrate 100 and the black matrix 102 form the first base substrate.

(6) Coating a spacer column film on the substrate with the aforementioned pattern formed thereon, masking, exposing and developing to form a pattern of a spacer column 3.

Figure 15:
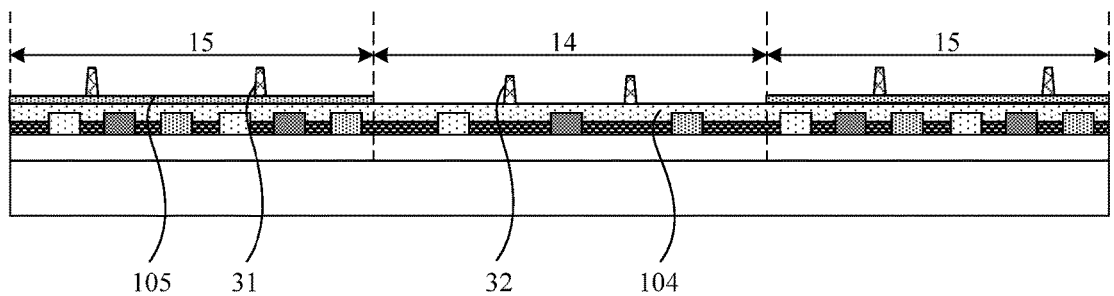
FIG. 15 is a structural diagram after formation of spacer columns according to an exemplary embodiment of the present disclosure.

In an exemplary embodiment, as shown in FIG. 15, there are a plurality of spacer columns 3, including first spacer columns 31 arranged on the spacer layer and second spacer columns 32 arranged on the flat layer 104. There is a difference in the height of the spacer layer 105 between the spacer columns in the bending zone 14 and the spacer columns in the non-bending zone 15. FIG. 15 is a structural diagram after formation of spacer columns according to an exemplary embodiment of the present disclosure.

Further, forming the array substrate may include:

(1) Coating a second substrate film on the glass carrier plate 5, and after curing to form a film, forming a second substrate 200.

In an exemplary embodiment, a material of the second substrate 200 may include polyimide, triacetate (TAC) or polymethylmethacrylate (PET).

(2) Forming an array structure layer on the second substrate 200.

In an exemplary embodiment, the array structure layer may be a conventional OTFT structure.

In an exemplary embodiment, forming the array structure layer on the second substrate, which includes forming a light shielding layer on the second substrate; depositing a first insulating film and a first metal film on the light shading layer, patterning the first metal film by a patterning process to form a first insulating layer and a pattern of a source-drain metal layer arranged on the first insulating layer, wherein the source-drain metal layer includes a source electrode and a drain electrode; depositing or coating an active layer film on the source-drain metal layer, and patterning the active layer film by a patterning process to form a pattern of an active layer, wherein an orthographic projection of the active layer on the second substrate is within the range of the orthographic projection of the light shielding layer on the second substrate; depositing a second insulating film and a second metal film on the active layer, patterning the second metal film by a patterning process to form a second insulating layer and a pattern of a gate metal layer arranged on the second insulating layer, wherein the gate metal layer includes a gate and a gate connection electrode; depositing a third insulating film on the gate metal layer, patterning the third insulating film by a patterning process to form a third insulating layer, wherein a via hole exposing the drain electrode is arranged on the third insulating layer, and the third insulating layer and the second insulating layer in the via hole are etched away. The second substrate and the array structure layer form a second base substrate.

In an exemplary embodiment, the material of the first insulating layer, the second insulating layer, the third insulating layer and the fourth insulating layer may be any one or more of silicon oxide (SiOx), silicon nitride (SiNx) and silicon oxynitride (SiON), and may be a single layer, multiple layers or a composite layer. The first metal film and the second metal film may be made of metal materials, such as any one or more of silver (Ag), copper (Cu), aluminum (Al), titanium (Ti) and molybdenum (Mo), or alloy materials of the above metals, such as aluminum neodymium alloy (AlNd) or molybdenum niobium alloy (MoNb), and may have a single-layer structure or a multi-layer composite structure. The active layer film may be any one or more of materials such as hexathiophene and polythiophene, that is, transistors manufactured by organic technology.

(3) Depositing a transparent conductive film on the base substrate with the aforementioned pattern formed thereon, and patterning the transparent conductive film by a patterning process to form a pattern of a pixel electrodes 209 that is connected to the drain electrode through the via hole.

Figure 16A:
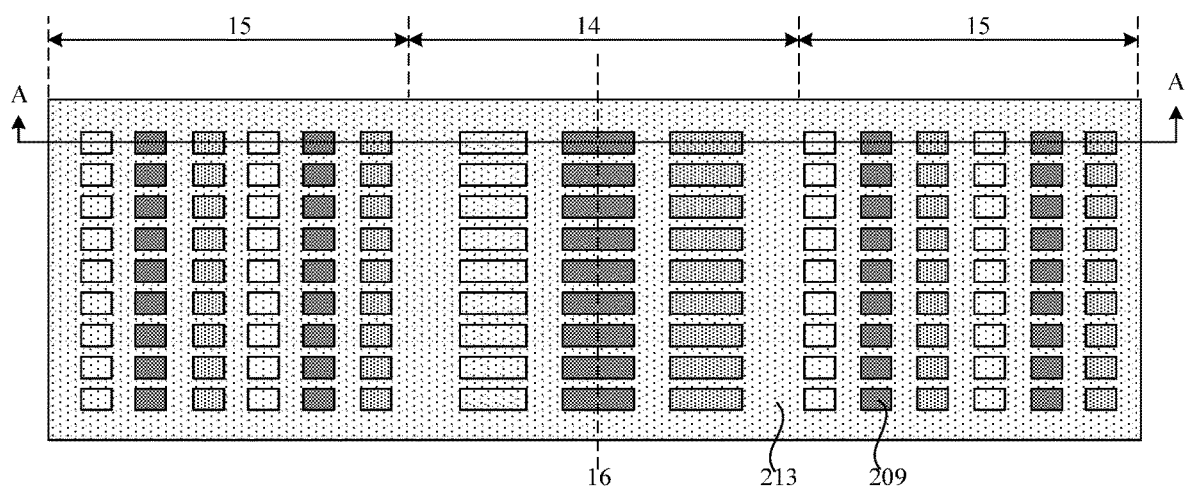
FIG. 16A is a plan view after formation of pixel electrodes according to an exemplary embodiment of the present disclosure.
Figure 16B:
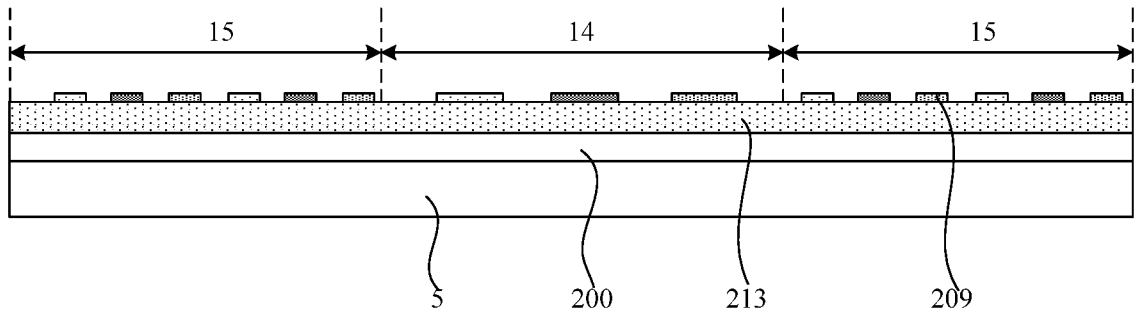
FIG. 16B is a sectional view at the position A-A in FIG. 16A.

In an exemplary embodiment, as shown in FIGS. 16A and 16B, the pixel electrodes 209 are distributed in multiple rows and columns. A density of the pixel electrodes 209 in the bending area 14 is less than that in the non-bending area 15. In an example, in the direction perpendicular to the bending axis 16, the length of the pixel electrodes 209 in the bending area 14 is larger than that in the non-bending area 15, and the spacing between adjacent pixel electrodes 209 in the bending area 14 is larger than that in the non-bending area 15. The length of the pixel electrodes 209 in the bending area 14 is larger than the length of the color resist block 101 in the bending area 14. In the direction parallel to the bending axis 16, the width of the pixel electrodes 209 in the bending area 14 is equal to that in the non-bending area 15, and the spacing between adjacent pixel electrodes 209 in the bending area 14 is equal to that in the non-bending area 15. The width of the pixel electrodes 209 in the bending area 14 is equal to the width of the color resist block 101 in the bending area 14. FIG. 16A is a plan view after formation of pixel electrodes according to an exemplary embodiment of the present disclosure, and FIG. 16B is a cross-sectional view at the position A-A in FIG. 16A.

In an exemplary embodiment, the transparent conductive film may be made of indium-doped tin oxide (ITO) or aluminum-doped zinc oxide (AZO).

Further, aligning and combining the color filter substrate and the array substrate into a cell may include:

drop-coating liquid crystal molecules 4 on the display area of the array substrate 2, and coating a sealant 6 on the non-display area of the color filter substrate 1; aligning the color filter substrate 1 and the array substrate 2; and pressing and curing the sealant 6 under a vacuum condition to form a display panel to be bent.

Figure 17:
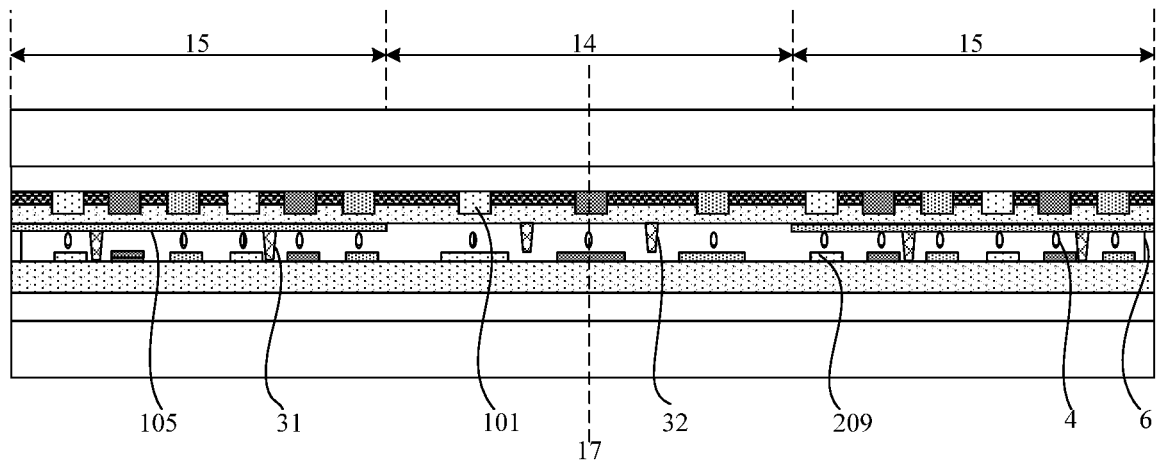
FIG. 17 is a layout diagram of an alignment mode of color resist blocks and pixel electrodes according to an exemplary embodiment of the present disclosure.

In an exemplary embodiment, the formed display panel to be bent is as shown in FIG. 17. FIG. 17 is a layout diagram of an alignment mode of color resist blocks and pixel electrodes according to an exemplary embodiment of the present disclosure.

In an exemplary embodiment, the liquid crystal molecules 4 may be self-aligned liquid crystal, so there is no need to provide an alignment layer.

In an exemplary embodiment, the color filter substrate 1 further includes a first alignment layer on the side facing the array substrate 2, and the array substrate 2 further includes a second alignment layer on the side facing the color filter substrate 1, and the liquid crystal is filled between the first alignment layer and the second alignment layer. In an exemplary embodiment, in the process of aligning and combining the color filter substrate 1 and the array substrate 2 into a cell, in the non-bending area 15, as shown in FIG. 17, the color resist blocks 101 are in one-to-one correspondence with the pixel electrodes 209, and a center of the orthographic projection of the color resist block 101 on the second substrate 200 coincides with a center of the orthographic projection of the corresponding pixel electrode 209 on the second substrate 200. In the bending area 14, the color resist blocks 101 are in one-to-one correspondence with the pixel electrodes 209, and a center of the orthographic projection of the color resist block 101 on the second substrate 200 coincides with a center of the orthographic projection of the corresponding pixel electrode 209 on the second substrate 200. The first spacer column 31 is supported between the second base substrate and the spacer layer 105, and there is a gap between the second spacer column 32 and the second base substrate, which is less than the thickness of the spacer layer 105.

Figure 18:
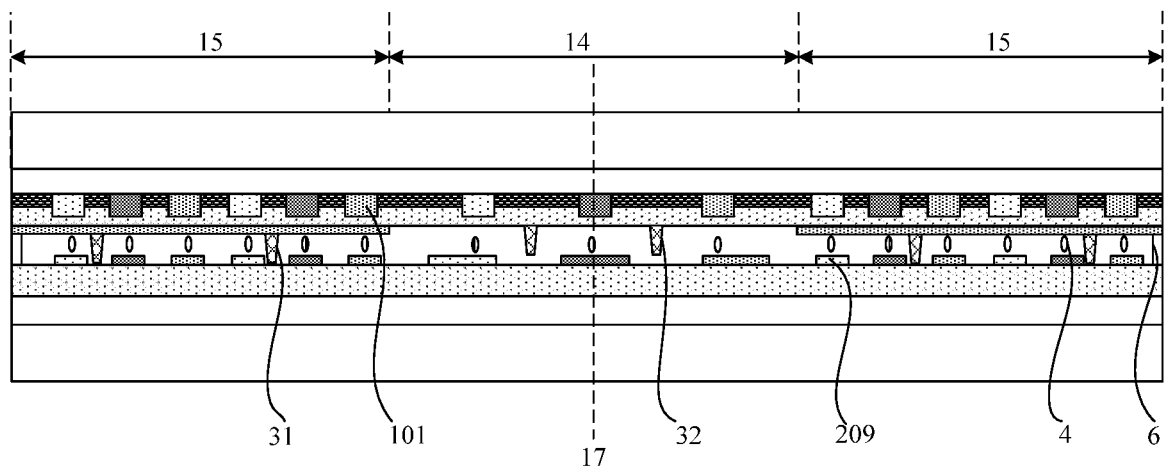
FIG. 18 is a layout diagram of another alignment mode of a color filter substrate and an array substrate according to an exemplary embodiment of the present disclosure.

In an exemplary embodiment, as shown in FIG. 18, in the bending area 14, the color resist blocks 101 are in one-to-one correspondence with the pixel electrodes 209, and the side of the color resist blocks 101 close to a bending center plane 17 is flush with the side of the corresponding pixel electrodes 209 close to the bending center plane 17. The bending center plane 17 may be perpendicular to the plane where the first substrate or the second substrate is located, and the bending axis 16 is located on this plane. FIG. 18 is a layout diagram of another alignment mode of a color filter substrate and an array substrate according to an exemplary embodiment of the present disclosure.

In an exemplary embodiment, the relative position of the pixel electrodes 209 and the color resist blocks 101 in the bending area 14 after alignment may be determined according to the bending radius of the display panel, the stretching condition of the first base substrate and the shrinking condition of the second base substrate.

In an exemplary embodiment, the preparation method may further include: bending the display panel to be bent.

Further, bending the display panel to be bent may include:

stripping the display panel to be bent from the glass carrier plate, bending the bending area 14, and fixing the display panel on the bending substrate with a preset shape to form the display panel.

In an exemplary embodiment, the formed display panel is as shown in FIGS. 7A and 7B, and the display panel includes:

a color filter substrate 1 and an array substrate 2 which are aligned and combined into a cell, wherein a liquid crystal layer is arranged between the color filter substrate 1 and the array substrate 2, and there are liquid crystal molecules 4 in the liquid crystal layer.

The color filter substrate 1 includes a first base substrate 1a, a plurality of color resist blocks 101 arranged at intervals on the first base substrate 1a, a flat layer 104 covering the plurality of color resist blocks 101, and a spacer layer 105 arranged on the flat layer 104. The density of the color resist blocks 101 in the bending area 14 is less than that in the non-bending area 15. In the direction perpendicular to the bending axis 16, the length of the color resist block 101 in the bending area 14 is equal to that in the non-bending area 15, and the spacing between the color resist blocks 101 in the bending area 14 is larger than that in the non-bending area 15. In the direction parallel to the bending axis 16, the width of the color resist block 101 in the bending area 14 is equal to that in the non-bending area 15, and the spacing between the color resist blocks 101 in the bending area 14 is equal to that in the non-bending area 15. The first base substrate 1a may include a first substrate 100 and a black matrix 102 arranged on the first substrate 100, wherein the black matrix 102 includes a pixel opening, and the color resist block 101 covers the pixel opening.

The array substrate 2 includes a second base substrate 2a and a plurality of pixel electrodes 209 arranged at intervals on the second base substrate 2a. The pixel electrodes 209 are in one-to-one correspondence with the color resist blocks 101. The density of the pixel electrodes 209 in the bending area 14 is less than that in the non-bending area 15. In the direction perpendicular to the bending axis 16, the length of the pixel electrodes 209 in the bending area 14 is larger than the length of the pixel electrodes 209 in the non-bending area 15 and the length of the color resist block 101 in the bending area 14, and the spacing between adjacent pixel electrodes 209 in the bending area 14 is larger than that in the non-bending area 15. In the direction parallel to the bending axis 16, the width of the pixel electrodes 209 in the bending area 14 is equal to the width of the pixel electrodes 209 in the non-bending area 15 and the width of the color resist block 101 in the bending area 14, and the spacing between adjacent pixel electrodes 209 in the bending area 14 is equal to that in the non-bending area 15. The second base substrate 2a may include a second substrate 200 and an array structure layer 213 arranged on the second substrate 200. The array structure layer 213 includes organic thin film transistors, and the pixel electrodes 209 are connected with the drain electrodes of the organic thin film transistors.

There are a plurality of spacer columns 3 supported between the color filter substrate 1 and the array substrate 2. The plurality of spacer columns 3 include first spacer columns 31 supported between the spacer layer 105 and the fourth insulating layer 210 and second spacer columns 32 supported between the flat layer 104 and the fourth insulating layer 210.

It can be seen from the preparation process of the display panel according to an embodiment of the present disclosure that in the bending process, in the bending area 14, the first base substrate 1a is stretched, the color resist block 101 is stretched, the color resist blocks 101 shift to the direction away from the bending center plane 17, the second base substrate 2a is squeezed, and the pixel electrodes 209 shift to the direction close to the bending center plane 17. Since the center of the orthographic projection of the color resist block 101 on the second substrate 200 coincides with the center of the orthographic projection of the corresponding pixel electrodes 209 on the second substrate 200, and in the direction perpendicular to the bending axis 16, the length of the pixel electrodes 209 is larger than that of the color resist block 101, even if the color resist blocks 101 shift to the direction away from the bending center plane 17 and the pixel electrodes 209 shift to the direction toward the bending center plane 17, the orthographic projection of the pixel electrodes 209 on the second substrate 200 may also cover the orthographic projection of the color resist block 101 on the second substrate 200, thus avoiding the light leakage caused by the misalignment between the pixel electrodes 209 and the color resist block 101. In an example, the color resist blocks 101 are in one-to-one correspondence with the pixel electrodes 209, and the side of the color resist blocks 101 close to the bending center plane 17 is flush with the side of the corresponding pixel electrodes 209 close to the bending center plane 17, which may more effectively avoid the misalignment between the pixel electrodes 209 and the color resist blocks 101 in the bending area 14 after bending.

In an example, the non-bending area 15 of the color filter substrate 1 may be provided with a spacer layer 105, so that there is a step difference between the bending area 14 and the non-bending area 15 of the display panel to be bent, and the thickness of the liquid crystal cell in the bending area 14 is larger than that in the non-bending area 15. After the display panel to be bent is bent, the thickness of the liquid crystal cell in the bending area 14 becomes smaller, enabling the thickness of the liquid crystal cell 14 in the bending area to be the same as that in the non-bending area 15, thereby ensuring that the contrast of the display screen in the bending area 14 is the same as that in the non-bending area 15, which improves the overall display effect of the display panel.

Figure 19:
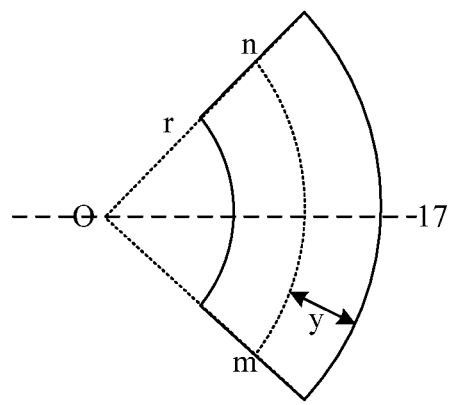
FIG. 19 is a stress analysis diagram of a bending area according to an exemplary embodiment of the present disclosure.

In an exemplary embodiment, the size and density of the pixel electrodes 209 and the color resist blocks 101 as well as the spacing between the pixel electrodes 209 and the spacing between the color resist blocks 101 in the bending area 14 may be obtained according to the following formulas:

$$\sigma = E^*\varepsilon = E^*y^*r^{-1} \qquad (1)$$

$$\Delta L = L^*\varepsilon \qquad (2)$$

σ represents the stress withstood by the film layer in the bending area; ε represents the strain of the film layer in the bending area; E is young's modulus of the film layer; Y is the distance from the film layer to the neutral layer, and the neutral layer is the film layer in the film layer structure that is not affected by stress, which may be the "mn" layer shown in FIG. 19 and may be obtained by simulation; L is the length of the film layer in the bending area before bending; r is the bending radius of the film layer. In this example, since the bending radius is large and the film layer is thin (micron level), the bending radius of the film layer may be constant and approximately equal to the bending radius of the display panel. FIG. 19 is a force analysis diagram of a bending area according to an exemplary embodiment of the present disclosure.

The strain value ε of the film layer may be obtained by formula (1), and the value of the length change ΔL of the film layer after bending may be obtained by formula (2). For the first base substrate, the distance of the color resist blocks in the bending area away from the bending axis may be obtained by the above formulas. For the second base substrate, the distance of the pixel electrodes in the bending area close to the bending axis may be obtained by the above formulas, and further the spacing between adjacent pixel electrodes, the spacing between color resist blocks and the length of the pixel electrodes in the direction perpendicular to the bending axis may be designed.

An embodiment of the present disclosure also provides another preparation method of a display panel, including:

forming a color filter substrate and an array substrate; and aligning and combining the color filter substrate and the array substrate into a cell.

Further, forming the color filter substrate may include:

(1) Coating a first substrate 100 film on a glass carrier plate 5, and after curing to form a film, forming a first substrate 100.

In an exemplary embodiment, a material of the first substrate 100 includes polyimide, triacetate (TAC) or polymethylmethacrylate (PET).

(2) Coating a strain film on the first substrate 100, and patterning the strain film by a patterning process to form a pattern of a strain layer.

Figure 20A:
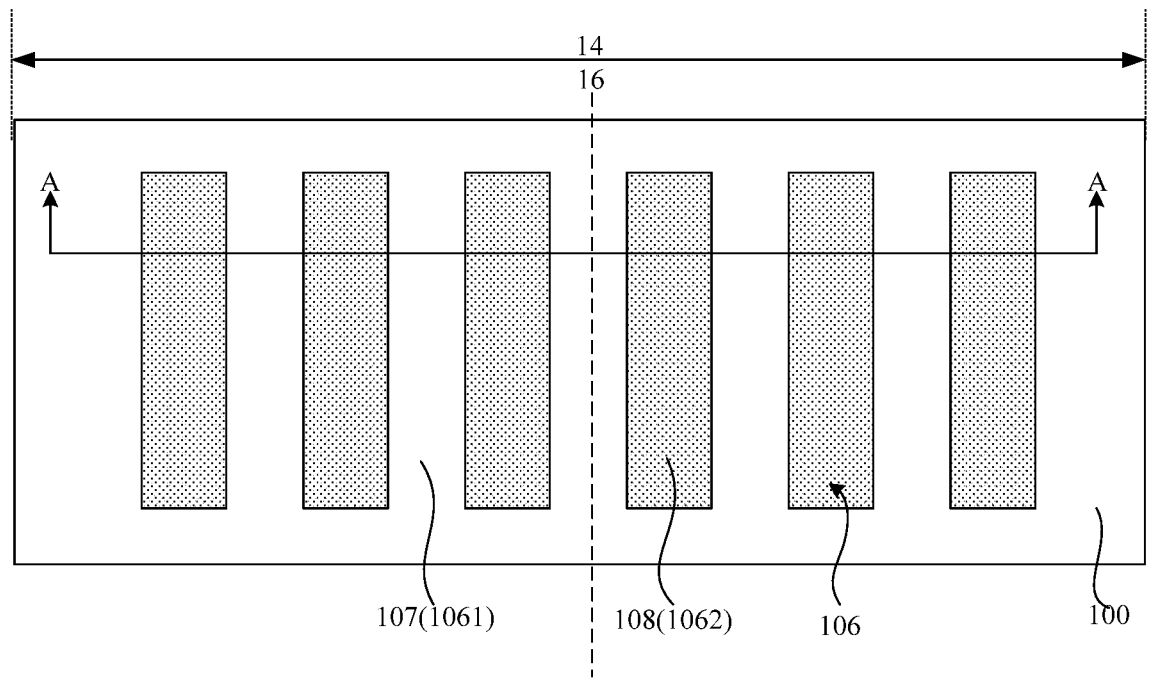
FIG. 20A is a plan view after formation of a strain layer according to an exemplary embodiment of the present disclosure.
Figure 20B:
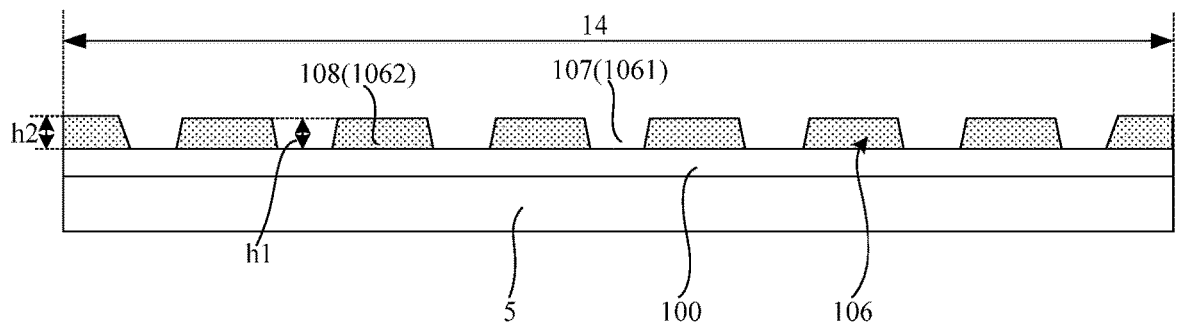
FIG. 20B is a sectional view at the position A-A in FIG. 20A.

In an exemplary embodiment, as shown in FIGS. 20A and 20B, the strain layer 106 is located in the bending area 14, and includes a first strain region 1061 and a second strain region 1062. The first strain region 1061 includes a plurality of first strain grooves 107 extending in a direction parallel to the bending axis 16 and arranged at intervals in a direction perpendicular to the bending axis 16. The second strain region 1062 includes pixel ribs formed between adjacent first strain grooves 107. The thickness of the strain layer 106 is 5 microns to 30 microns, and the depth h1 of the first strain groove 107 is less than or equal to the thickness h2 of the strain layer 106 in the direction perpendicular to the first substrate. Since the strain layer of the first strain region 1061 is etched away or partially etched away, and the thickness of the first strain region 1061 is less than that of the second strain region 1062, the tensile modulus of the first strain region 1061 is less than that of the second strain region 1062. FIG. 20A is a plan view after formation of a strain layer according to an exemplary embodiment of the present disclosure, and FIG. 20B is a sectional view at the position A-A in FIG. 20A.

In an exemplary embodiment, the preparation process of the strain layer may include: coating a strain film on the first substrate 100, and imprinting the strain film by an imprinting process to form a pattern of the strain layer. The strain material may be transparent optical glue, such as acrylate type, polyurethane type or organic silica gel type.

In an example, a similar design may be made for the non-bending area 15. For example, the strain layer 106 is formed in the non-bending area 15 of the display panel. In an example, the strain layer 106 may not be formed in the non-bending area 15.

(3) Coating a black matrix 102 film on the first substrate 100, and patterning the black matrix 102 film by a patterning process to form a pattern of the black matrix 102.

Figure 21A:
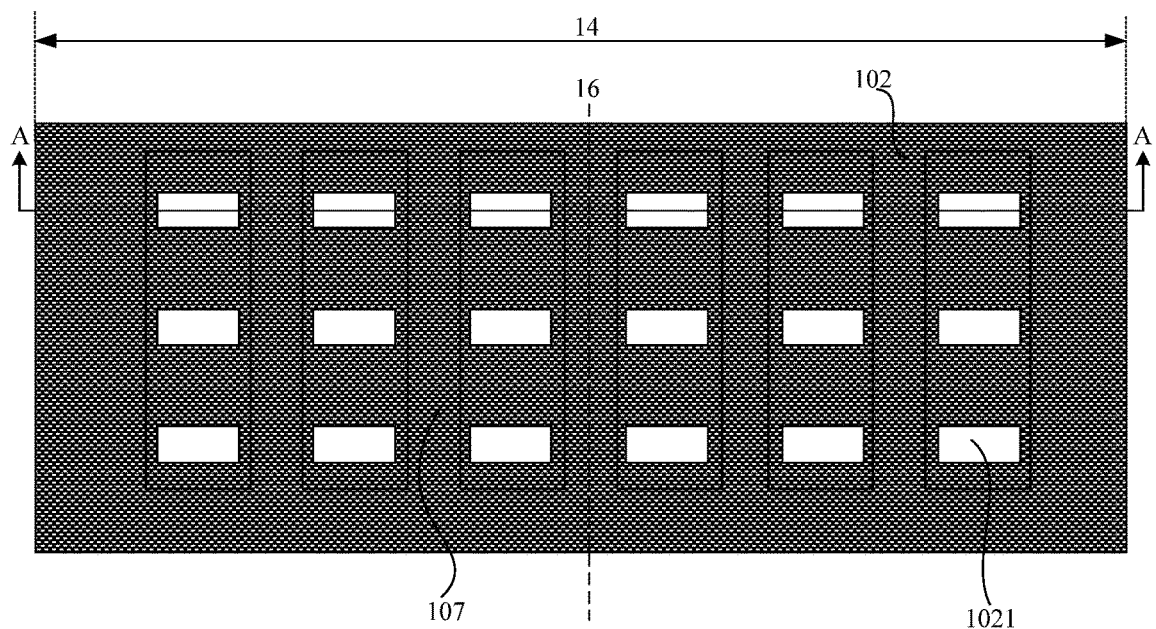
FIG. 21A is a plan view after formation of a black matrix according to an exemplary embodiment of the present disclosure.
Figure 21B:
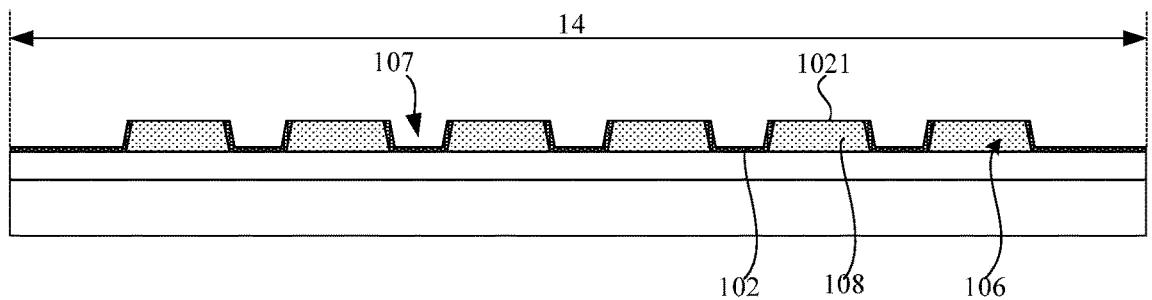
FIG. 21B is a sectional view at the position A-A in FIG. 21A.

In an exemplary embodiment, as shown in FIGS. 21A and 21B, the black matrix 102 covers the strain layer 106 and includes pixel openings 1021 arranged in an array. The pixel openings 1021 expose the second strain region 1062 and are located on the pixel ribs 108. FIG. 21A is a plan view after formation of a black matrix according to an exemplary embodiment of the present disclosure, and FIG. 21B is a sectional view at the position A-A in FIG. 21A.

(4) Coating a color resist film on the substrate with the aforementioned pattern, masking, exposing and developing to form a pattern of color resist blocks 101.

Figure 22A:
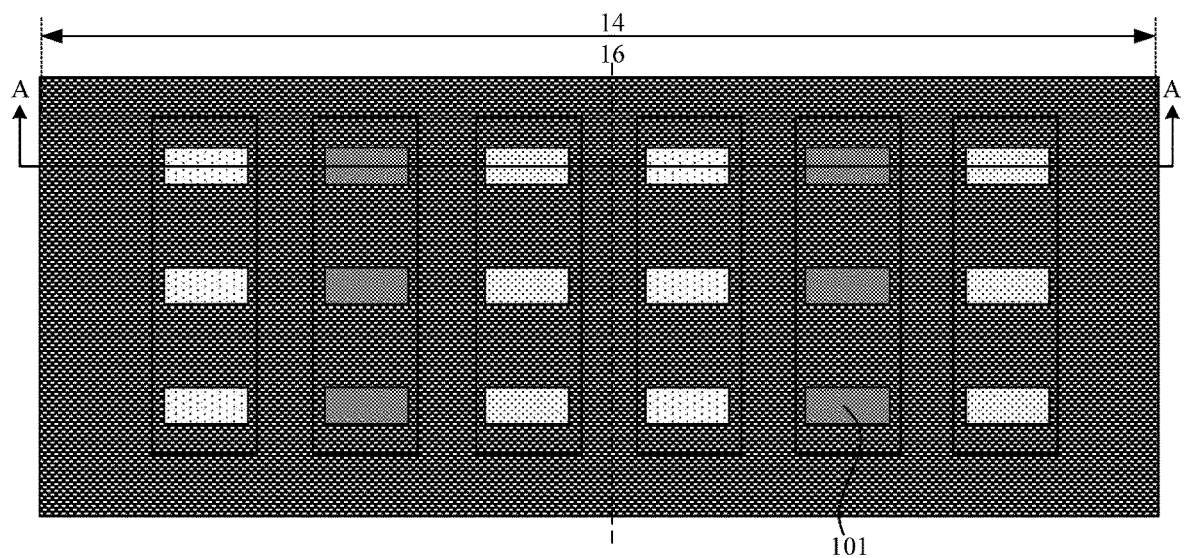
FIG. 22A is a plan view after formation of color resist blocks according to an exemplary embodiment of the present disclosure.
Figure 22B:
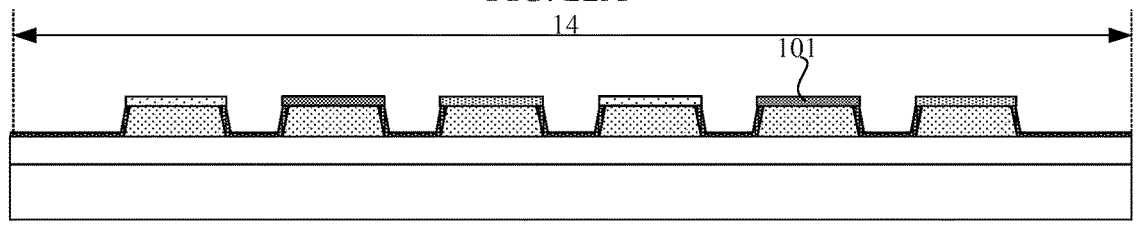
FIG. 22B is a sectional view at the position A-A in FIG. 22A.

In an exemplary embodiment, as shown in FIGS. 22A and 22B, the color resist blocks 101 cover the pixel openings. FIG. 22A is a plan view after formation of color resist blocks according to an exemplary embodiment of the present disclosure, and FIG. 22B is a sectional view at the position A-A in FIG. 22A.

A first color filter substrate is formed through the aforementioned preparation process.

Further, forming the color filter substrate may include:

(1) Coating a first substrate 100 film on a glass carrier plate, and forming a first substrate 100 after the first substrate 100 film cures to form a film.

In an exemplary embodiment, a material of the first substrate 100 includes polyimide, triacetate (TAC) or polymethylmethacrylate (PET).

(2) Coating a strain film on the first substrate 100, and patterning the strain film by a patterning process to form a pattern of a strain layer 106.

Figure 23A:
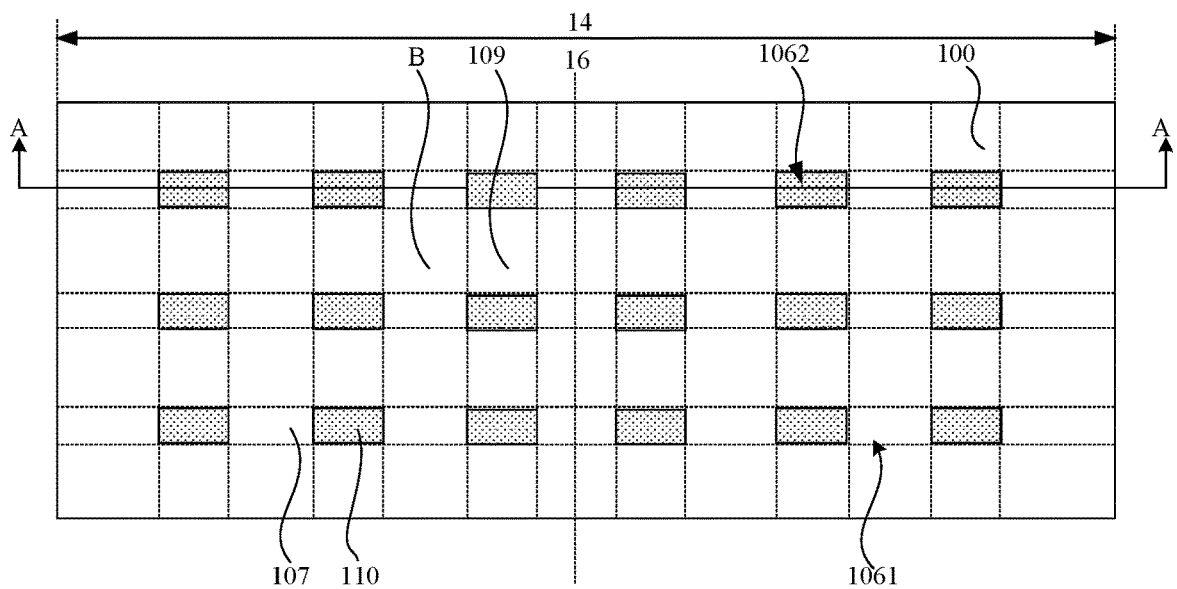
FIG. 23A is a plan view after formation of another strain layer according to an exemplary embodiment of the present disclosure.
Figure 23B:
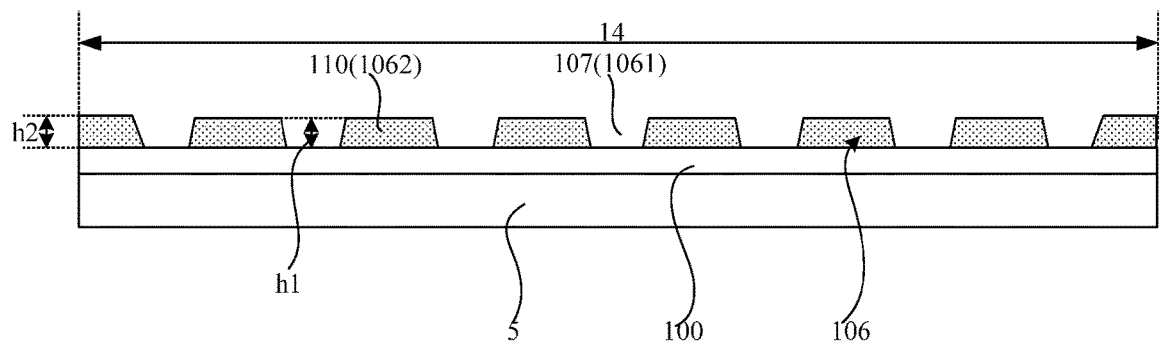
FIG. 23B is a sectional view at the position A-A in FIG. 23A.

In an exemplary embodiment, as shown in FIGS. 23A and 23B, the strain layer 106 is located in the bending area 14, and includes a first strain region 1061 and a second strain region 1062. The first strain region 1061 includes a plurality of first strain grooves 107 extending in a direction parallel to the bending axis 16 and arranged at intervals in a direction perpendicular to the bending axis 16, and a plurality of second strain grooves 109 extending in a direction perpendicular to the bending axis 16 and arranged at intervals in a direction parallel to the bending axis 16. The first strain layer 107 and the second strain grooves may be interconnected, and the interconnection position is position B shown in FIG. 23A. The second strain region 1062 includes pixel islands 110 formed between the first strain grooves 107 and the second strain grooves 109. The orthographic projection of the pixel island 110 on the first substrate 100 may be circular or rectangular. FIG. 23A is a plan view after formation of another strain layer according to an exemplary embodiment of the present disclosure, and FIG. 23B is a sectional view at the position A-A in FIG. 23A.

In an exemplary embodiment, in a direction perpendicular to the first substrate, the thickness of the strain layer 106 may be 5 microns to 30 microns, and the depth h1 of the first strain groove 107 and the depth of the second strain groove 109 may be less than or equal to the thickness h2 of the strain layer 106. Since the strain layer of the first strain region 1061 is etched away or partially etched away, and the thickness of the first strain region 1061 is less than that of the second strain region 1062, the tensile modulus of the first strain region 1061 is less than that of the second strain region 1062.

In an exemplary embodiment, the preparation process of the strain layer may include: coating a strain film on the first substrate 100, and imprinting the strain film by an imprinting process to form a pattern of the strain layer.

In an example, a similar design may be made for the non-bending area 15. For example, the strain layer 106 is formed in the non-bending area 15 of the display panel. In an example, the strain layer 106 may not be formed in the non-bending area 15.

(3) Coating a black matrix 102 film on the first substrate 100, and patterning the black matrix 102 film by a patterning process to form a pattern of the black matrix 102 layer.

Figure 24:
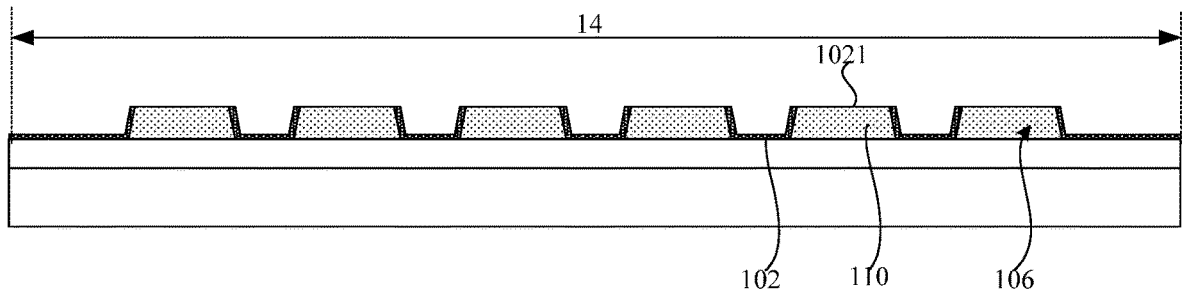
FIG. 24 is a structural diagram after formation of another black matrix according to an exemplary embodiment of the present disclosure.

In an exemplary embodiment, as shown in FIG. 24, the black matrix 102 covers the first strain region 1061, that is, the black matrix 102 covers the first strain groove 107 and the second strain groove 109. The black matrix 102 includes pixel openings 1021 arranged in an array. The pixel openings 1021 expose the second strain region 1062 and are located on the pixel islands 110. FIG. 24 is a structural diagram after formation of another black matrix according to an exemplary embodiment of the present disclosure.

(4) Coating a color resist film on the substrate with the aforementioned pattern, masking, exposing and developing to form a pattern of color resist blocks 101.

In an exemplary embodiment, the color resist blocks 101 are located in the second strain region 1061, and cover the pixel openings.

After the above steps, the preparation of a color filter substrate is completed. The first substrate 100, the strain layer 106 and the black matrix 102 form the first base substrate.

A second color filter substrate is formed through the above processes.

Further, forming the array substrate may include:

(1) Forming a second substrate on a glass carrier. For the preparation process, reference may be made to the preparation processes of the second substrate 200 in the previous embodiment, and the details are omitted here.

(2) Forming an array structure layer on the second substrate. For the preparation process, reference may be made to the preparation processes of the array structure layer in the previous embodiment, and the details are omitted here.

(3) Depositing a transparent conductive film on the substrate with the aforementioned pattern formed thereon, and patterning the transparent conductive film by a patterning process to form a pattern of pixel electrodes. The pixel electrodes are connected with drain electrodes of the array structure layer through via holes.

The preparation of an array substrate is completed above.

(5) Forming spacer columns on the substrate with the aforementioned pattern formed thereon.

In an exemplary embodiment, the color filter substrate is the first color filter substrate. As shown in FIG. 9B, the spacer column 3 corresponds to the pixel rib 108 in position and is located between adjacent color resist blocks.

In an exemplary embodiment, the color filter substrate is the second color filter substrate. As shown in FIG. 10B, the spacer column 3 corresponds to the first strain groove 107 or the second strain groove 109 or the interconnection position between the first strain groove 107 and the second strain groove 109.

In an exemplary embodiment, the color filter substrate is the first color filter substrate, and the spacer column may be formed on the color filter substrate.

Further, aligning and combining the color filter substrate and the array substrate into a cell may include:

drop-coating liquid crystal on the display area of the array substrate 2, and coating a sealant on the non-display area of the color filter substrate 1; aligning the color filter substrate 1 and the array substrate 2; and pressing and curing the sealant under a vacuum condition to form a display panel to be bent.

In an exemplary embodiment, the liquid crystal may be self-aligned liquid crystal.

In an exemplary embodiment, the color filter substrate 1 further includes a first alignment layer on the side facing the array substrate 2, and the array substrate 2 further includes a second alignment layer on the side facing the color filter substrate 1, and the liquid crystal is filled between the first alignment layer and the second alignment layer.

In an exemplary embodiment, the preparation method may further include: bending the display panel to be bent.

Further, bending the display panel to be bent may include:

stripping the display panel to be bent from the glass carrier plate, bending the bending area 14, and fixing the display panel on the bending substrate with a preset shape to form the display panel shown in FIG. 9A or 10A.

In an exemplary embodiment, the formed display panel, as shown in FIG. 9A or 10A, includes:

a color filter substrate 1 and an array substrate 2 which are aligned and combined into a cell, and a liquid crystal layer formed between the color filter substrate 1 and the array substrate 2, wherein the liquid crystal layer includes liquid crystal molecules 4, and the color filter substrate 1 includes a first substrate 100 and a strain layer 106 arranged on the first substrate 100. The strain layer 106 includes a first strain region 1061 and a second strain region 1062. In an example, the first strain region 1061 includes a plurality of first strain grooves 107 extending in a direction parallel to the bending axis 16 and arranged at intervals in a direction perpendicular to the bending axis 16. The second strain region 1062 includes pixel ribs formed between adjacent first strain grooves 107. The black matrix 102 covers the strain layer 106. The black matrix 102 includes pixel openings 1021 arranged in an array, and the color resist block 101 covers the pixel openings 1021. In another example, the first strain region 1061 includes a plurality of first strain grooves 107 extending in a direction parallel to the bending axis 16 and arranged at intervals in a direction perpendicular to the bending axis 16, and a plurality of second strain grooves 109 extending in a direction perpendicular to the bending axis 16 and arranged at intervals in a direction parallel to the bending axis 16. The first strain region includes pixel islands 110 formed between the first strain grooves 107 and the second strain grooves 109. The black matrix 102 covers the first strain region 1061, and includes pixel openings 1021 arranged in an array. The pixel openings 1021 are located on the second strain region 1062. The color resist block 101 covers the pixel opening 1021. The first substrate 100, the strain layer 106 and the black matrix 102 form a first base substrate. The array substrate 2 includes a second substrate 200, an array structure layer 213 arranged on the second substrate 200, pixel electrodes 209 arranged on the array structure layer 213, a fourth insulating layer 210 covering the pixel electrodes 209 and common electrodes 211 arranged on the fourth insulating layer 210. The second substrate 200 and the array structure layer 213 form the second base substrate.

The spacer column 3 is arranged between the color filter substrate 1 and the array substrate 2. In an example, the spacer column 3 corresponds to the pixel rib 108 in position. In an example, the spacer column 3 corresponds to the first strain groove 107 or the second strain groove 109 or the interconnection position between the first strain groove 107 and the second strain groove 109.

It can be seen from the preparation process of the exemplary embodiment of the present disclosure that because the black matrix 102 is partially or fully located in the first strain region 1061, and the color resist blocks 101 are located in the second strain region 1062. The film layer structure at the position of the black matrix 102 has a low tensile modulus and belongs to a weak tensile region, while the film layer structure at the position of the color resist block 101 has a high tensile modulus and belongs to a strong tensile region. In the process of bending the display panel to be bent, the strain of the color filter substrate 1 mainly occurs at the position of the black matrix 102, thereby reducing the deformation of the color resist block 101 and preventing the color resist blocks 101 from being widely misaligned with the pixel electrodes 209 of the array substrate 2. After the black matrix 102 is stretched and deformed, the light shielding area thereof covers a larger area, which may effectively reduce the risk of light leakage caused by the misalignment between the pixel electrodes 209 and the color resist blocks 101. In an example, after aligning and combining into a cell, the spacer column 3 holds up the first strain groove 107 or the second strain groove 109 or the interconnection position between the first strain groove 107 and the second strain groove 109. In the subsequent bending and deforming process, the first strain groove 107 or the second strain groove 109 or the interconnection position between the first strain groove 107 and the second strain groove 109 may effectively prevent the spacer column 3 from being out of position, thereby effectively reducing the risk of light leakage caused by the spacer column 3 scratching the display area of the array substrate 2 during the bending process.

An embodiment of the present disclosure further provides a preparation method of a display panel, including:

forming a color filter substrate, wherein the color filter substrate includes a first substrate and a plurality of color resist blocks arranged at intervals on the first substrate, the color filter substrate includes a bending area and a non-bending area, and a density of the color resist blocks in the bending area is less than that in the non-bending area;

forming an array substrate, wherein the array substrate includes a first substrate and a plurality of pixel electrodes arranged at intervals on the first substrate, the array substrate includes a bending area and a non-bending area, and a density of the pixel electrodes in the bending area is less than that in the non-bending area; and aligning and combining the color filter substrate and the array substrate into a cell, wherein the color resist blocks are in one-to-one correspondence with the pixel electrodes.

In an exemplary embodiment, forming the color filter substrate includes:

forming a first substrate;

forming a strain layer on the first substrate, wherein the strain layer includes a first strain region and a second strain region, and a tensile modulus of the first strain region is less than that of the second strain region;

forming a black matrix on the strain layer, wherein the black matrix covers the strain layer and is provided with pixel openings exposing the second strain region;

forming color resist blocks on the black matrix, wherein the color resist blocks cover the pixel openings;

wherein the first substrate, the strain layer and the black matrix constitute the first base substrate.

An embodiment of the present disclosure further provides a display apparatus including the display panel of the aforementioned embodiment. The display apparatus mainly involve a curved display apparatus with a fixed curvature, including mobile phones, curved TV sets or curtain wall displays, etc.

Although the embodiments disclosed in embodiments of the present disclosure are described as above, the described contents are only the embodiments for facilitating understanding of the present disclosure, which are not intended to limit the present disclosure. Any person skilled in the field to which the present disclosure pertains can make any modifications and variations in the forms and details of implementation without departing from the spirit and the scope disclosed in the present disclosure, but the patent protection scope of the present disclosure should still be subject to the scope defined by the appended claims.

What is claimed is:

1. A display panel, comprising:
   an array substrate and a color filter substrate which are aligned and combined into a cell, wherein the color filter substrate comprises a first base substrate and a plurality of color resist blocks arranged at intervals on the first base substrate, the array substrate comprises a second base substrate and a plurality of pixel electrodes arranged at intervals on the second base substrate, the pixel electrodes are in one-to-one correspondence with the color resist blocks, the display panel comprises a bending area and a non-bending area located at least on one side of the bending area, a density of the pixel electrodes in the bending area is less than a density of the pixel electrodes in the non-bending area, and a density of the color resist blocks in the bending area is less than a density of the color resist blocks in the non-bending area,
   wherein the first base substrate comprises a first substrate, a strain layer arranged on the first substrate, and a black matrix arranged on the strain layer, the black matrix is arranged between adjacent color resist blocks, the strain layer is at least arranged in the bending area, the strain layer comprises a first strain region and a second strain region, the black matrix covers the first strain region, the color resist blocks are located in the second strain region, and a tensile modulus of the first strain region is less than a tensile modulus of the second strain region.

2. The display panel according to claim 1, wherein in a direction perpendicular to a bending axis of the bending area, a spacing between adjacent pixel electrodes in the bending area is larger than a spacing between adjacent pixel electrodes in the non-bending area, a spacing between adjacent color resist blocks in the bending area is larger than a spacing between adjacent color resist blocks in the non-bending area; in a direction parallel to the bending axis of the bending area, the spacing between adjacent pixel electrodes in the bending area is equal to the spacing between adjacent pixel electrodes in the non-bending area, and the spacing between adjacent color resist blocks in the bending area is equal to the spacing between adjacent color resist blocks in the non-bending area.

3. The display panel according to claim 1, wherein in a direction perpendicular to a bending axis of the bending area, a length of the pixel electrodes in the bending area is larger than a length of the color resist blocks in the bending area.

4. The display panel according to claim 3, wherein in the direction perpendicular to the bending axis of the bending area, the length of the pixel electrodes in the bending area is 30 microns to 400 microns, and the length of the color resist blocks in the bending area is 20 microns to 200 microns.

5. The display panel according to claim 1, wherein in a direction parallel to a bending axis of the bending area, a width of the pixel electrodes in the non-bending area is equal to a width of the pixel electrodes in the bending area, and a width of the color resist blocks in the non-bending area is equal to a width of the color resist blocks in the bending area.

6. The display panel according to claim 1, wherein the color filter substrate further comprises a flat layer covering the color resist blocks and a spacer layer arranged on the flat layer, the spacer layer is located in the non-bending area, the display panel further comprises a plurality of spacer columns arranged between the array substrate and the color filter substrate, the plurality of spacer columns comprise first spacer columns supported between the spacer layer and the second base substrate, and second spacer columns supported between the flat layer and the second base substrate.

7. The display panel according to claim 1, wherein the first strain region comprises a plurality of first strain grooves extending in a direction parallel to a bending axis of the bending area and arranged at intervals in a direction perpendicular to the bending axis of the bending area, the second strain region comprises pixel ribs formed between adjacent first strain grooves, and the black matrix covers the first strain grooves and the pixel ribs except positions corresponding to the color resist blocks.

8. The display panel according to claim 7, wherein a depth of the first strain grooves is less than or equal to a thickness of the strain layer in a direction perpendicular to the first substrate.

9. The display panel according to claim 7, further comprising spacer columns arranged between the color filter substrate and the array substrate, wherein the spacer columns correspond to the pixel ribs in position and are located between adjacent color resist blocks.

10. The display panel according to claim 1, wherein the first strain region comprises a plurality of first strain grooves extending in a direction parallel to a bending axis of the bending area and arranged at intervals in a direction perpendicular to the bending axis of the bending area and a plurality of second strain grooves extending in a direction perpendicular to the bending axis of the bending area and arranged at intervals in a direction parallel to the bending axis of the bending area, the second strain region comprises pixel islands formed between the second strain grooves and the first strain grooves, the color resist blocks are located on one side of the pixel islands close to the array substrate, and the black matrix covers the first strain grooves and the second strain grooves.

11. The display panel according to claim 10, wherein in a direction perpendicular to the first substrate, a depth of the first strain grooves is less than or equal to a thickness of the strain layer, and a depth of the second strain grooves is less than or equal to the thickness of the strain layer.

12. The display panel according to claim 11, further comprising spacer columns arranged between the color filter substrate and the array substrate, wherein the spacer columns correspond to the first strain grooves or the second strain grooves in position.

13. The display panel according to claim 1, wherein a thickness of the strain layer is 5 microns to 30 microns.

14. The display panel according to claim 1, wherein, after bending, orthographic projections of the color resist blocks of the bending area on the second base substrate are located within ranges of orthographic projections of the pixel electrodes corresponding to the color resist blocks in the bending area on the second base substrate.

15. The display panel according to claim 1, wherein in a direction perpendicular to a bending axis of the bending area, a length of the pixel electrodes in the non-bending area is less than a length of the pixel electrodes in the bending area; and in a direction parallel to the bending axis of the bending area, a width of the pixel electrodes in the non-bending area is equal to a width of the pixel electrodes in the bending area.

16. The display panel according to claim 1, wherein in a direction perpendicular to a bending axis of the bending area, a length of the color resist blocks in the non-bending area is equal to a length of the pixel electrodes in the bending area; and in a direction parallel to the bending axis of the bending area, a width of the color resist blocks in the non-bending area is equal to a width of the color resist blocks in the bending area.

17. A display apparatus, comprising the display panel according to claim 1.

18. A preparation method of a display panel, comprising:
   forming a color filter substrate, wherein the color filter substrate comprises a first base substrate and a plurality of color resist blocks arranged at intervals on the first base substrate, the color filter substrate comprises a bending area and a non-bending area, and a density of the color resist blocks in the bending area is less than a density of the color resist blocks in the non-bending area;
   forming an array substrate, wherein the array substrate comprises a first base substrate and a plurality of pixel electrodes arranged at intervals on the first base substrate, the array substrate comprises a bending area and a non-bending area, and a density of the pixel electrodes in the bending area is less than a density of the pixel electrodes in the non-bending area; and
   aligning and combining the color filter substrate and the array substrate into a cell, wherein the color resist blocks are in one-to-one correspondence with the pixel electrodes,
   wherein forming the color filter substrate comprises:
   forming a first substrate;
   forming a strain layer on the first substrate, wherein the strain layer comprises a first strain region and a second strain region, and a tensile modulus of the first strain region is less than a tensile modulus of the second strain region;

forming a black matrix on the strain layer, wherein the black matrix covers the strain layer and is provided with pixel openings exposing the second strain region; and forming the color resist blocks on the black matrix, wherein the color resist blocks cover the pixel openings;

wherein the first substrate, the strain layer and the black matrix form the first base substrate.

* * * * *